United States Patent
Schloss et al.

(10) Patent No.: US 12,327,762 B2
(45) Date of Patent: Jun. 10, 2025

(54) MOLYBDENUM FILL

(71) Applicant: Lam Research Corporation, Fremont, CA (US)

(72) Inventors: Lawrence Schloss, Palo Alto, CA (US); Shruti Vivek Thombare, Sunnyvale, CA (US); Zhongbo Yan, Newark, CA (US); Patrick A. Van Cleemput, Duvall, WA (US); Joshua Collins, Sunnyvale, CA (US)

(73) Assignee: Lam Research Corporation, Fremont, CA (US)

( * ) Notice: Subject to any disclaimer, the term of this patent is extended or adjusted under 35 U.S.C. 154(b) by 363 days.

(21) Appl. No.: 17/763,529

(22) PCT Filed: Oct. 14, 2020

(86) PCT No.: PCT/US2020/055596
§ 371 (c)(1),
(2) Date: Mar. 24, 2022

(87) PCT Pub. No.: WO2021/076636
PCT Pub. Date: Apr. 22, 2021

(65) Prior Publication Data

US 2022/0375792 A1 Nov. 24, 2022

Related U.S. Application Data

(60) Provisional application No. 62/915,492, filed on Oct. 15, 2019.

(51) Int. Cl.
H01L 21/768 (2006.01)
C23C 16/04 (2006.01)
(Continued)

(52) U.S. Cl.
CPC ...... H01L 21/76879 (2013.01); C23C 16/045 (2013.01); C23C 16/06 (2013.01);
(Continued)

(58) Field of Classification Search
CPC .................................... H01L 21/76879
See application file for complete search history.

(56) References Cited

U.S. PATENT DOCUMENTS 1,012,671 A 12/1911 Long
5,028,565 A 7/1991 Chang et al.
(Continued)

FOREIGN PATENT DOCUMENTS

CN 1332267 A 1/2002
CN 1675402 A 9/2005
(Continued)

OTHER PUBLICATIONS

Anonymous, "Lam Research enables next-generation memory with industry's first ALD process for low-fluorine tungsten fill" Semiconductor Digest News and Industry Trends for Solid State Technology, Aug. 2016, 2 Pages.
(Continued)

*Primary Examiner* — William A Harriston
(74) *Attorney, Agent, or Firm* — Weaver Austin Villeneuve & Sampson LLP

(57) ABSTRACT

Embodiments of methods of filling features with molybdenum (Mo) include depositing a first layer of Mo in a feature including an opening and an interior and non-conformally treating the first layer such that regions near the opening preferentially treated over regions in the interior. In some embodiments, a second Mo layer is deposited on the treated first layer. Embodiments of methods of filling features with Mo include controlling Mo precursor flux to transition between conformal and non-conformal fill.

25 Claims, 17 Drawing Sheets

(51) Int. Cl.
*C23C 16/06* (2006.01)
*C23C 16/455* (2006.01)
*C23C 16/56* (2006.01)
*H10B 69/00* (2023.01)

(52) U.S. Cl.
CPC ........ *C23C 16/45553* (2013.01); *C23C 16/56* (2013.01); *H01L 21/76856* (2013.01); *H01L 21/76865* (2013.01); *H01L 21/76876* (2013.01); *H10B 69/00* (2023.02)

(56) References Cited

U.S. PATENT DOCUMENTS

| | | | |
|---|---|---|---|
| 5,502,005 A | 3/1996 | Mikagi | |
| 5,612,254 A | 3/1997 | Mu et al. | |
| 5,643,394 A | 7/1997 | Maydan et al. | |
| 5,661,080 A | 8/1997 | Hwang et al. | |
| 5,795,824 A | 8/1998 | Hancock | |
| 5,804,249 A | 9/1998 | Sukharev et al. | |
| 5,863,836 A | 1/1999 | Jones | |
| 5,956,609 A | 9/1999 | Lee et al. | |
| 6,066,366 A | 5/2000 | Berenbaum et al. | |
| 6,103,609 A | 8/2000 | Lee et al. | |
| 6,107,200 A | 8/2000 | Takagi et al. | |
| 6,143,082 A | 11/2000 | McInerney et al. | |
| 6,271,084 B1 | 8/2001 | Tu et al. | |
| 6,284,653 B1 | 9/2001 | Tseng | |
| 6,306,216 B1 | 10/2001 | Kim et al. | |
| 6,359,160 B1 | 3/2002 | Sun et al. | |
| 6,635,965 B1 | 10/2003 | Lee et al. | |
| 6,794,287 B2 | 9/2004 | Saanila et al. | |
| 6,844,258 B1 | 1/2005 | Fair et al. | |
| 6,958,174 B1 | 10/2005 | Klaus et al. | |
| 7,005,372 B2 | 2/2006 | Levy et al. | |
| 7,141,494 B2 | 11/2006 | Lee et al. | |
| 7,250,367 B2 | 7/2007 | Vaartstra et al. | |
| 7,262,125 B2 | 8/2007 | Wongsenakhum et al. | |
| 7,560,581 B2 | 7/2009 | Gordon et al. | |
| 7,589,017 B2 | 9/2009 | Chan et al. | |
| 7,691,749 B2 | 4/2010 | Levy et al. | |
| 7,772,114 B2 | 8/2010 | Chan et al. | |
| 7,955,972 B2 | 6/2011 | Chan et al. | |
| 8,053,365 B2 | 11/2011 | Humayun et al. | |
| 8,058,170 B2 | 11/2011 | Chandrashekar et al. | |
| 8,089,128 B2 | 1/2012 | Ramaswamy et al. | |
| 8,101,521 B1 | 1/2012 | Gao et al. | |
| 8,278,216 B1 | 10/2012 | Alers et al. | |
| 9,076,646 B2 | 7/2015 | Sims et al. | |
| 9,082,826 B2 | 7/2015 | Chandrashekar et al. | |
| 9,159,571 B2 | 10/2015 | Humayun et al. | |
| 9,175,023 B2 | 11/2015 | Odedra et al. | |
| 9,236,297 B2 | 1/2016 | Chen et al. | |
| 9,548,266 B2 | 1/2017 | Ajuria et al. | |
| 9,583,385 B2 | 2/2017 | Lee et al. | |
| 9,595,470 B2 | 3/2017 | Bamnolker et al. | |
| 9,613,818 B2 | 4/2017 | Ba et al. | |
| 9,653,353 B2 | 5/2017 | Chandrashekar et al. | |
| 9,659,998 B1 | 5/2017 | Lung | |
| 9,899,372 B1 | 2/2018 | Bi et al. | |
| 9,978,605 B2 | 5/2018 | Bamnolker et al. | |
| 10,079,144 B2 | 9/2018 | Kim et al. | |
| 10,094,021 B2 | 10/2018 | Lansalot-Matras et al. | |
| 10,121,671 B2 | 11/2018 | Fu et al. | |
| 10,283,404 B2 | 5/2019 | Na et al. | |
| 10,395,984 B2 | 8/2019 | Backes et al. | |
| 10,505,111 B1 | 12/2019 | Ok et al. | |
| 10,510,590 B2 | 12/2019 | Thombare et al. | |
| 10,510,951 B1 | 12/2019 | Yu et al. | |
| 10,566,211 B2 | 2/2020 | Chandrashekar et al. | |
| 10,573,522 B2 | 2/2020 | Jandl et al. | |
| 10,622,375 B2 | 4/2020 | Chun et al. | |
| 10,643,826 B2 | 5/2020 | Kim et al. | |
| 10,643,904 B2 | 5/2020 | Xie et al. | |
| 10,731,250 B2 | 8/2020 | Kim et al. | |
| 10,734,238 B2 | 8/2020 | Zhou et al. | |
| 10,777,453 B2 | 9/2020 | Thombare et al. | |
| 10,995,405 B2 | 5/2021 | Dezelah et al. | |
| 11,211,253 B2 | 12/2021 | Zhou et al. | |
| 11,355,345 B2 | 6/2022 | Jandl et al. | |
| 11,549,175 B2 | 1/2023 | Butail et al. | |
| 11,821,071 B2 | 11/2023 | Blakeney | |
| 11,970,776 B2 | 4/2024 | Collins et al. | |
| 12,014,928 B2 | 6/2024 | Ba et al. | |
| 12,074,029 B2 | 8/2024 | Van Cleemput et al. | |
| 12,148,623 B2 | 11/2024 | Van Cleemput et al. | |
| 2001/0002326 A1 | 5/2001 | Yang et al. | |
| 2002/0009872 A1 | 1/2002 | Hoshino et al. | |
| 2002/0024140 A1 | 2/2002 | Nakajima et al. | |
| 2002/0045355 A1 | 4/2002 | Chong et al. | |
| 2002/0090796 A1 | 7/2002 | Desai et al. | |
| 2003/0019428 A1 | 1/2003 | Ku et al. | |
| 2003/0059980 A1 | 3/2003 | Chen et al. | |
| 2003/0082296 A1 | 5/2003 | Elers et al. | |
| 2003/0104126 A1 | 6/2003 | Fang et al. | |
| 2003/0127043 A1 | 7/2003 | Lu et al. | |
| 2003/0194825 A1 | 10/2003 | Law et al. | |
| 2003/0209193 A1 | 11/2003 | Van Wijck | |
| 2004/0087143 A1 | 5/2004 | Norman et al. | |
| 2004/0202786 A1 | 10/2004 | Wongsenakhum et al. | |
| 2005/0031786 A1 | 2/2005 | Lee et al. | |
| 2005/0186342 A1 | 8/2005 | Sager et al. | |
| 2005/0212139 A1 | 9/2005 | Leinikka et al. | |
| 2005/0277296 A1 | 12/2005 | Adetutu et al. | |
| 2005/0282384 A1 | 12/2005 | Nawafune et al. | |
| 2006/0040052 A1 | 2/2006 | Fang et al. | |
| 2006/0046521 A1 | 3/2006 | Vaartstra et al. | |
| 2006/0102950 A1 | 5/2006 | Takebuchi et al. | |
| 2006/0115590 A1 | 6/2006 | Suzuki et al. | |
| 2007/0009658 A1 | 1/2007 | Yoo et al. | |
| 2007/0066060 A1 | 3/2007 | Wang | |
| 2007/0077712 A1 | 4/2007 | Joo et al. | |
| 2007/0190780 A1 | 8/2007 | Chung et al. | |
| 2007/0215852 A1 | 9/2007 | Lung | |
| 2007/0232015 A1 | 10/2007 | Liu | |
| 2008/0014352 A1 | 1/2008 | Xi et al. | |
| 2008/0061282 A1 | 3/2008 | Sato et al. | |
| 2008/0116437 A1 | 5/2008 | Oh et al. | |
| 2008/0124926 A1 | 5/2008 | Chan et al. | |
| 2008/0170984 A1 | 7/2008 | Tenne et al. | |
| 2008/0197335 A1 | 8/2008 | Yu | |
| 2008/0206987 A1 | 8/2008 | Gelatos et al. | |
| 2008/0227291 A1 | 9/2008 | Lai et al. | |
| 2008/0254623 A1 | 10/2008 | Chan et al. | |
| 2008/0268642 A1 | 10/2008 | Yanagita et al. | |
| 2008/0280390 A1 | 11/2008 | Kim et al. | |
| 2008/0303014 A1 | 12/2008 | Goux et al. | |
| 2008/0317972 A1 | 12/2008 | Hendriks et al. | |
| 2009/0004848 A1 | 1/2009 | Kim et al. | |
| 2009/0053893 A1 | 2/2009 | Khandelwal et al. | |
| 2009/0081374 A1 | 3/2009 | Yang et al. | |
| 2009/0149022 A1 | 6/2009 | Chan et al. | |
| 2009/0212280 A1 | 8/2009 | Werner et al. | |
| 2009/0239368 A1 | 9/2009 | Park et al. | |
| 2009/0304914 A1 | 12/2009 | Nalla et al. | |
| 2010/0107927 A1 | 5/2010 | Stewart et al. | |
| 2010/0159694 A1 | 6/2010 | Chandrashekar et al. | |
| 2010/0167527 A1 | 7/2010 | Wu et al. | |
| 2010/0168404 A1 | 7/2010 | Girolami et al. | |
| 2010/0176512 A1 | 7/2010 | Yang et al. | |
| 2010/0207245 A1 | 8/2010 | Cheng et al. | |
| 2010/0213541 A1 | 8/2010 | Jeon et al. | |
| 2010/0227473 A1 | 9/2010 | Matsuda et al. | |
| 2010/0320607 A1 | 12/2010 | Suzuki | |
| 2011/0020546 A1 | 1/2011 | Hamalainen et al. | |
| 2011/0021024 A1 | 1/2011 | Calvo-Munoz et al. | |
| 2011/0146568 A1 | 6/2011 | Haukka et al. | |
| 2011/0151615 A1 | 6/2011 | Gordon et al. | |
| 2011/0155993 A1 | 6/2011 | Chen | |
| 2011/0223763 A1 | 9/2011 | Chan et al. | |
| 2011/0256645 A1 | 10/2011 | Tam et al. | |
| 2011/0256726 A1 | 10/2011 | LaVoie et al. | |
| 2011/0287184 A1 | 11/2011 | Shenai-Khatkhate et al. | |
| 2012/0045589 A1 | 2/2012 | Ivanov et al. | |
| 2012/0119177 A1 | 5/2012 | Erbetta | |

(56) References Cited

U.S. PATENT DOCUMENTS

| | | |
|---|---|---|
| 2012/0187305 A1 | 7/2012 | Elam et al. |
| 2012/0231626 A1 | 9/2012 | Lee et al. |
| 2012/0305872 A1 | 12/2012 | Yoon |
| 2013/0109172 A1 | 5/2013 | Collins et al. |
| 2013/0164928 A1 | 6/2013 | Lim et al. |
| 2013/0189837 A1 | 7/2013 | Haukka et al. |
| 2013/0270703 A1 | 10/2013 | Zierath et al. |
| 2013/0302980 A1 | 11/2013 | Chandrashekar et al. |
| 2014/0106083 A1 | 4/2014 | Wu et al. |
| 2014/0138604 A1 | 5/2014 | Liu et al. |
| 2014/0147589 A1 | 5/2014 | Khandelwal et al. |
| 2014/0217590 A1 | 8/2014 | Nalla et al. |
| 2014/0349477 A1 | 11/2014 | Chandrashekar et al. |
| 2014/0370192 A1 | 12/2014 | Odedra et al. |
| 2015/0024592 A1 | 1/2015 | Chandrashekar et al. |
| 2015/0170961 A1 | 6/2015 | Romero et al. |
| 2015/0179461 A1 | 6/2015 | Bamnolker et al. |
| 2015/0262939 A1 | 9/2015 | Sakata |
| 2015/0325475 A1 | 11/2015 | Bamnolker et al. |
| 2015/0348840 A1 | 12/2015 | Bamnolker et al. |
| 2015/0354064 A1 | 12/2015 | Kolics et al. |
| 2016/0027614 A1 | 1/2016 | Manna et al. |
| 2016/0040289 A1 | 2/2016 | Gatineau et al. |
| 2016/0056074 A1 | 2/2016 | Na et al. |
| 2016/0064409 A1 | 3/2016 | Yaegashi |
| 2016/0077435 A1 | 3/2016 | Ban et al. |
| 2016/0104624 A1 | 4/2016 | Fu et al. |
| 2016/0109800 A1 | 4/2016 | Bae et al. |
| 2016/0118345 A1 | 4/2016 | Chen et al. |
| 2016/0141419 A1 | 5/2016 | Baenninger et al. |
| 2016/0168699 A1 | 6/2016 | Fukazawa et al. |
| 2016/0172211 A1 | 6/2016 | Demos et al. |
| 2016/0181272 A1 | 6/2016 | Rabkin et al. |
| 2016/0225632 A1 | 8/2016 | Shaikh et al. |
| 2016/0233220 A1 | 8/2016 | Danek et al. |
| 2016/0300952 A1 | 10/2016 | Toriumi et al. |
| 2016/0309596 A1 | 10/2016 | Shaviv et al. |
| 2016/0343612 A1 | 11/2016 | Wang et al. |
| 2016/0351401 A1 | 12/2016 | Ba et al. |
| 2016/0351444 A1 | 12/2016 | Schloss et al. |
| 2017/0040214 A1 | 2/2017 | Lai et al. |
| 2017/0062224 A1 | 3/2017 | Fu et al. |
| 2017/0062714 A1 | 3/2017 | Kau |
| 2017/0069527 A1 | 3/2017 | Haukka et al. |
| 2017/0117155 A1 | 4/2017 | Bamnolker et al. |
| 2017/0125548 A1 | 5/2017 | Hung et al. |
| 2017/0229341 A1 | 8/2017 | Chang et al. |
| 2017/0268107 A1 | 9/2017 | Lansalot-Matras et al. |
| 2017/0294381 A1 | 10/2017 | Briggs et al. |
| 2017/0306479 A1 | 10/2017 | Raisanen et al. |
| 2017/0306490 A1 | 10/2017 | Chan et al. |
| 2017/0350008 A1 | 12/2017 | Collins et al. |
| 2017/0358482 A1 | 12/2017 | Chen et al. |
| 2018/0019165 A1 | 1/2018 | Baum et al. |
| 2018/0053660 A1 | 2/2018 | Jandl et al. |
| 2018/0142345 A1 | 5/2018 | Meng et al. |
| 2018/0151497 A1 | 5/2018 | Makala et al. |
| 2018/0166276 A1 | 6/2018 | Nakao et al. |
| 2018/0240675 A1 | 8/2018 | Bamnolker et al. |
| 2018/0240676 A1 | 8/2018 | Chan et al. |
| 2018/0247832 A1 | 8/2018 | Fischer et al. |
| 2018/0261503 A1 | 9/2018 | Meng et al. |
| 2018/0286668 A1 | 10/2018 | Baum et al. |
| 2018/0294187 A1 | 10/2018 | Thombare et al. |
| 2018/0342390 A1 | 11/2018 | Xiao et al. |
| 2018/0355484 A1 | 12/2018 | Lansalot-Matras et al. |
| 2019/0003050 A1 | 1/2019 | Dezelah et al. |
| 2019/0006226 A1 | 1/2019 | Khare et al. |
| 2019/0019725 A1* | 1/2019 | Chandrashekar ............ H01L 21/32133 |
| 2019/0067003 A1 | 2/2019 | Zope et al. |
| 2019/0067014 A1 | 2/2019 | Shrestha et al. |
| 2019/0067094 A1 | 2/2019 | Zope et al. |
| 2019/0088474 A1 | 3/2019 | Macdonald et al. |
| 2019/0088555 A1 | 3/2019 | Xie et al. |
| 2019/0157102 A1 | 5/2019 | Jian et al. |
| 2019/0157141 A1 | 5/2019 | Liao et al. |
| 2019/0161853 A1 | 5/2019 | Aoyama et al. |
| 2019/0177838 A1 | 6/2019 | Cadot et al. |
| 2019/0189456 A1 | 6/2019 | Mullick et al. |
| 2019/0189688 A1 | 6/2019 | Lille |
| 2019/0226086 A1 | 7/2019 | Wright, Jr. et al. |
| 2019/0256467 A1 | 8/2019 | Anthis et al. |
| 2019/0273019 A1 | 9/2019 | Mullick et al. |
| 2019/0282384 A1 | 9/2019 | Phillips |
| 2019/0368039 A1 | 12/2019 | Arteaga et al. |
| 2019/0371662 A1 | 12/2019 | Chen et al. |
| 2020/0006073 A1 | 1/2020 | Smith et al. |
| 2020/0010954 A1 | 1/2020 | Bhuyan et al. |
| 2020/0075403 A1 | 3/2020 | Thombare et al. |
| 2020/0105515 A1 | 4/2020 | Maes et al. |
| 2020/0111675 A1 | 4/2020 | Takatsuki et al. |
| 2020/0144066 A1 | 5/2020 | Jandl et al. |
| 2020/0152870 A1 | 5/2020 | Lin et al. |
| 2020/0194670 A1 | 6/2020 | Allegra |
| 2020/0199743 A1 | 6/2020 | Wright, Jr. et al. |
| 2020/0219933 A1 | 7/2020 | Cheng |
| 2020/0227275 A1 | 7/2020 | Mullick et al. |
| 2020/0242209 A1* | 7/2020 | Bowes ............... G06F 30/33 |
| 2020/0332416 A1 | 10/2020 | Fluit |
| 2020/0343136 A1 | 10/2020 | Yu et al. |
| 2020/0365456 A1 | 11/2020 | Thombare et al. |
| 2020/0402846 A1 | 12/2020 | Collins et al. |
| 2021/0047726 A1 | 2/2021 | Liu et al. |
| 2021/0057223 A1 | 2/2021 | Stevens et al. |
| 2021/0082750 A1 | 3/2021 | Yu et al. |
| 2021/0098532 A1 | 4/2021 | Wu |
| 2021/0123136 A1 | 4/2021 | Kalutarage et al. |
| 2021/0140043 A1 | 5/2021 | Thombare et al. |
| 2021/0140048 A1 | 5/2021 | Moon et al. |
| 2021/0151352 A1 | 5/2021 | Zope et al. |
| 2021/0238736 A1 | 8/2021 | Butail et al. |
| 2021/0277517 A1 | 9/2021 | Liu et al. |
| 2021/0285102 A1 | 9/2021 | Yoon et al. |
| 2021/0313183 A1* | 10/2021 | Ba ............... H01L 21/28562 |
| 2021/0320034 A1 | 10/2021 | Lei et al. |
| 2021/0348271 A1 | 11/2021 | Mishra et al. |
| 2021/0407809 A1 | 12/2021 | Zope et al. |
| 2022/0013365 A1 | 1/2022 | Van Cleemput et al. |
| 2022/0018017 A1 | 1/2022 | Kim et al. |
| 2022/0037163 A1 | 2/2022 | Yang et al. |
| 2022/0044929 A1 | 2/2022 | Xiao et al. |
| 2022/0139713 A1 | 5/2022 | Färm et al. |
| 2022/0170155 A1 | 6/2022 | Blakeney |
| 2022/0195598 A1 | 6/2022 | Collins et al. |
| 2022/0220136 A1 | 7/2022 | Leoncini et al. |
| 2022/0220139 A1 | 7/2022 | Leoncini et al. |
| 2022/0220607 A1 | 7/2022 | Leoncini et al. |
| 2022/0223471 A1 | 7/2022 | Thombare et al. |
| 2022/0262640 A1 | 8/2022 | Jandl et al. |
| 2022/0285211 A1 | 9/2022 | Färm et al. |
| 2022/0298624 A1 | 9/2022 | Blakeney et al. |
| 2022/0325410 A1 | 10/2022 | Yoon et al. |
| 2022/0328317 A1 | 10/2022 | Na et al. |
| 2022/0356579 A1 | 11/2022 | Collins et al. |
| 2022/0359211 A1 | 11/2022 | Van Cleemput et al. |
| 2022/0389579 A1 | 12/2022 | Thombare et al. |
| 2023/0290680 A1 | 9/2023 | Collins et al. |
| 2023/0326790 A1 | 10/2023 | Tarafdar et al. |
| 2024/0052486 A1 | 2/2024 | Blakeney |
| 2024/0136192 A1 | 4/2024 | Schloss et al. |
| 2024/0234152 A9 | 7/2024 | Schloss et al. |
| 2024/0271281 A1 | 8/2024 | Collins et al. |
| 2024/0282580 A1 | 8/2024 | Ba et al. |
| 2024/0297075 A1 | 9/2024 | Thombare et al. |
| 2024/0401196 A1 | 12/2024 | Thombare et al. |
| 2025/0029840 A1 | 1/2025 | Van Cleemput et al. |
| 2025/0038003 A1 | 1/2025 | Mandia et al. |

FOREIGN PATENT DOCUMENTS

| | | |
|---|---|---|
| CN | 1957446 A | 5/2007 |
| CN | 101308794 A | 11/2008 |
| CN | 101752299 A | 6/2010 |

(56) References Cited

FOREIGN PATENT DOCUMENTS

| | | |
|---|---|---|
| CN | 102206387 A | 10/2011 |
| CN | 102206387 B | 4/2014 |
| CN | 104272441 A | 1/2015 |
| CN | 104752339 A | 7/2015 |
| CN | 105097446 A | 11/2015 |
| CN | 105280549 A | 1/2016 |
| CN | 106575626 A | 4/2017 |
| CN | 107305838 A | 10/2017 |
| CN | 107710443 A | 2/2018 |
| CN | 107768304 A | 3/2018 |
| CN | 109072424 A | 12/2018 |
| CN | 109563621 A | 4/2019 |
| CN | 109661481 A | 4/2019 |
| EP | 1167567 A1 | 1/2002 |
| EP | 1728894 A1 | 12/2006 |
| EP | 1806352 A1 | 7/2007 |
| JP | S595246 A | 1/1984 |
| JP | H02231714 A | 9/1990 |
| JP | H03131023 A | 6/1991 |
| JP | H11238736 A | 8/1999 |
| JP | 2001172049 A | 6/2001 |
| JP | 2001257177 A | 9/2001 |
| JP | 2001274105 A | 10/2001 |
| JP | 2001284360 A | 10/2001 |
| JP | 2003528215 A | 9/2003 |
| JP | 2005150416 A | 6/2005 |
| JP | 2006511716 A | 4/2006 |
| JP | 2007019375 A | 1/2007 |
| JP | 2007182443 A | 7/2007 |
| JP | 2008205219 A | 9/2008 |
| JP | 2008211183 A | 9/2008 |
| JP | 2011035366 A | 2/2011 |
| JP | 2012246531 A | 12/2012 |
| JP | 2014074190 A | 4/2014 |
| JP | 2014511380 A | 5/2014 |
| JP | 2015021175 A | 2/2015 |
| JP | 2015029097 A | 2/2015 |
| JP | 2016098406 A | 5/2016 |
| JP | 2016516892 A | 6/2016 |
| JP | 2016164131 A | 9/2016 |
| JP | 2017053024 A | 3/2017 |
| JP | 2017525156 A | 8/2017 |
| JP | 2018035375 A | 3/2018 |
| JP | 2019502253 A | 1/2019 |
| JP | 2019044266 A | 3/2019 |
| JP | 2019527302 A | 9/2019 |
| JP | 2019186508 A | 10/2019 |
| JP | 2019192906 A | 10/2019 |
| JP | 2020029618 A | 2/2020 |
| JP | 2020043139 A | 3/2020 |
| JP | 2020059916 A | 4/2020 |
| JP | 2020513065 A | 4/2020 |
| JP | 2021523983 A | 9/2021 |
| JP | 2021535575 A | 12/2021 |
| JP | 7485736 B2 | 5/2024 |
| KR | 0138381 B1 | 6/1998 |
| KR | 20030043201 A | 6/2003 |
| KR | 100477840 B1 | 6/2005 |
| KR | 20050054122 A | 6/2005 |
| KR | 20100068845 A | 6/2010 |
| KR | 20100096488 A | 9/2010 |
| KR | 20100114855 A | 10/2010 |
| KR | 20110014069 A | 2/2011 |
| KR | 20110024932 A | 3/2011 |
| KR | 20140034081 A | 3/2014 |
| KR | 20140138092 A | 12/2014 |
| KR | 20150063562 A | 6/2015 |
| KR | 20150077376 A | 7/2015 |
| KR | 20150108780 A | 9/2015 |
| KR | 20150128615 A | 11/2015 |
| KR | 20160072054 A | 6/2016 |
| KR | 20160098986 A | 8/2016 |
| KR | 101745074 B1 | 6/2017 |
| KR | 20170095801 A | 8/2017 |
| KR | 20180009702 A | 1/2018 |
| KR | 20180018372 A | 2/2018 |
| KR | 20180019487 A | 2/2018 |
| KR | 20180114159 A | 10/2018 |
| KR | 20190024834 A | 3/2019 |
| KR | 20190028743 A | 3/2019 |
| KR | 20190130046 A | 11/2019 |
| KR | 20200056543 A | 5/2020 |
| KR | 20200090108 A | 7/2020 |
| KR | 20210156444 A | 12/2021 |
| TW | 201123305 A | 7/2011 |
| TW | 201542857 A | 11/2015 |
| TW | 201705490 A | 2/2017 |
| TW | 201710543 A | 3/2017 |
| TW | 201738405 A | 11/2017 |
| TW | 201741325 A | 12/2017 |
| TW | 201812069 A | 4/2018 |
| TW | 201812070 A | 4/2018 |
| TW | 201907037 A | 2/2019 |
| TW | 201920740 A | 6/2019 |
| WO | WO-0127347 A1 | 4/2001 |
| WO | WO-2006036865 A2 | 4/2006 |
| WO | WO-2007005088 A2 | 1/2007 |
| WO | WO-2012047591 A1 | 4/2012 |
| WO | WO-2014052642 A1 | 4/2014 |
| WO | WO-2015023404 A1 | 2/2015 |
| WO | WO-2016191432 A1 | 12/2016 |
| WO | WO-2017070634 A1 | 4/2017 |
| WO | WO-2017091571 A1 | 6/2017 |
| WO | WO-2017143246 A1 | 8/2017 |
| WO | WO-2018191183 A1 | 10/2018 |
| WO | WO-2019099233 A1 | 5/2019 |
| WO | WO-2019118684 A1 | 6/2019 |
| WO | WO-2019232344 A1 | 12/2019 |
| WO | WO-2020023790 A1 | 1/2020 |
| WO | WO-2020028587 A1 | 2/2020 |
| WO | WO-2020106649 A1 | 5/2020 |
| WO | WO-2020185618 A1 | 9/2020 |
| WO | WO-2021035236 A1 | 2/2021 |
| WO | WO-2021046058 A1 | 3/2021 |
| WO | WO-2021076636 A1 | 4/2021 |
| WO | WO-2021178399 A1 | 9/2021 |
| WO | WO-2021237032 A1 | 11/2021 |
| WO | WO-2022108762 A1 | 5/2022 |
| WO | WO-2022150270 A1 | 7/2022 |
| WO | WO-2022221210 A1 | 10/2022 |
| WO | WO-2023114648 A1 | 6/2023 |

OTHER PUBLICATIONS

Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.

Barry,S.T., et al., "The Chemistry of Inorganic Precursors during the Chemical Deposition of Films on Solid Surfaces," Accounts of chemical research, 2018, vol. 51, pp. 800-809.

Chinese First Office Action dated Jan. 4, 2021 issued in Application No. CN 201710700258.6.

Chinese Second Office Action dated Jun. 17, 2021 issued in Application No. CN 201710700258.6.

Chiu, H. et al., "Deposition of Molybdenum Carbonitride Thin Films from Mo(NBu$^t$)$_2$(NHBu$^t$)$_2$,", J. Mater. Res, Jul. 1994, vol. 9, No. 7, pp. 1622-1624.

CN Office Action dated Feb. 28, 2023 in Application No. 201880038116.0 with English translation.

CN Office Action dated Jan. 13, 2023 in CN Application No. CN201980049916.7 with English Translation.

CN Office Action dated Jan. 16, 2023 in Application No. CN202080020646.X with English translation.

CN Office Action dated Nov. 17, 2022, in Application No. CN202080011300.3 with English translation.

Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.

(56) References Cited

OTHER PUBLICATIONS

Cotton, F.A., "Strong Homonuclear Metal-Metal Bonds," Accounts of Chemical Research, 1969, vol. 2 (8), pp. 240-247.
Coventor Brochure "3D NAND: Challenges Beyond 96-Layer Memory Arrays", Oct. 12, 2018, pp. 1-4.
Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.
Dezelah IV, C.L., et al., "Atomic Layer Deposition of Tungsten(III) Oxide Thin Films from W2(NMe2)6 and Water: Precursor-Based Control of Oxidation State in the Thin Film Material," Journal of the American Chemical Society, Aug. 2, 2006, vol. 128(30), pp. 9638-9639.
Dominique, S. et al., "An alternative to Tungsten in 3D-NAND technology", IEEE International Interconnect Technology Conference (IITC), 2021, pp. 1-3.
Final Office Action dated May 23, 2019 issued in U.S. Appl. No. 15/948,143.
Final Office Action dated Sep. 2, 2021 issued in U.S. Appl. No. 16/947,286.
International Preliminary Report on Patentability dated Dec. 1, 2022, in PCT Application No. PCT/US2021/033564.
International Preliminary Report on Patentability dated Mar. 10, 2022, in Application No. PCT/US2020/070434.
International Preliminary Report on Patentability dated Mar. 3, 2022, in Application No. PCT/US2020/070390.
International Search Report and Written Opinion dated Feb. 3, 2021, in Application No. PCT/US2020/055596.
International Search Report and Written Opinion dated Jun. 9, 2022 in International Application No. PCT/US2022/017005.
International Search Report and Written Opinion dated Sep. 9, 2021 in Application No. PCT/US2021/033564.
International Preliminary Report on Patentability dated Apr. 28, 2022, in PCT Application No. PCT/US2020/055596.
International Preliminary Report on Patentability dated Aug. 12, 2021, issued in Application No. PCT/US2020/015241.
International Preliminary Report on Patentability dated Feb. 11, 2021 issued in Application No. PCT/US2019/044541.
International Preliminary Report on Patentability dated Feb. 4, 2021 in Application No. PCT/US2019/043514.
International Preliminary Report on Patentability dated Jun. 3, 2021 in Application No. PCT/US2019/062067.
International Preliminary Report on Patentability dated Jun. 4, 2020 in Application No. PCT/US2018/061803.
International Preliminary Report on Patentability dated Mar. 9, 2006 issued in Application No. PCT/US2004/006940.
International Preliminary Report on Patentability dated Mar. 17, 2022 in PCT Application No. PCT/US2020/048951.
International Preliminary Report on Patentability dated Nov. 12, 2020 in Application No. PCT/US2019/030712.
International Preliminary Report on Patentability dated Oct. 24, 2019 in Application No. PCT/US2018/026746.
International Preliminary Report on Patentability dated Sep. 23, 2021 issued in Application No. PCT/US2020/021543.
International Search Report and Written Opinion dated Apr. 7, 2023 in PCT Application No. PCT/US2022/080705.
International Search Report and Written Opinion dated Apr. 27, 2023 in PCT Application No. PCT/US2022/080863.
International Search Report and Written Opinion dated Aug. 19, 2019 in Application No. PCT/US2019/030712.
International Search Report and Written Opinion dated Dec. 4, 2020, in PCT Application No. PCT/US2020/048951.
International Search Report and Written Opinion dated Feb. 4, 2021, in PCT Application No. PCT/US2020/070390.
International Search Report and Written Opinion dated Jul. 1, 2020 in Application No. PCT/US2020/021543.
International Search Report and Written Opinion dated Jul. 27, 2018 in Application No. PCT/US2018/026746.
International Search Report and Written Opinion dated Jun. 19, 2023, in Application No. PCT/US2023/062877.
International Search Report and Written Opinion dated Jun. 3, 2020, issued in Application No. PCT/US2020/015241.
International Search Report and Written Opinion dated Mar. 8, 2019 in Application No. PCT/US2018/061803.
International Search Report and Written Opinion dated Mar. 9, 2020 in Application No. PCT/US2019/062067.
International Search Report and Written Opinion dated Nov. 11, 2019 in Application No. PCT/US2019/043514.
International Search Report and Written Opinion dated Nov. 11, 2020 issued in Application No. PCT/US2020/070434.
International Search Report and Written Opinion dated Nov. 27, 2019 in Application No. PCT/US2019/044541.
International Search Report and Written Opinion dated Sep. 7, 2022 in Application No. PCT/US2022/028845.
Ishihara, S., et al., "MOCVD of Monolayer MoS2 using Novel Molybdenum Precursor i-Pr2DADMo(CO)3," Materials Research Society, 2018, vol. 3, pp. 379-384.
Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.
Johnson, R.W., Hultqvist, A., Bent, S.F., "A brief review of atomic layer deposition: from fundamentals to applications", Materials today, (Jun. 1, 2014), 17(5):236-46.
JP Office Action dated Apr. 19, 2022 in Application No. JP20200504286 with English translation.
JP Office Action dated Jun. 6, 2023 in Application No. JP2020561743 With English translation.
Juppo, et al., "Deposition of Molybdenum Thin Films by an Alternate Supply of MoCl 5 and Zn," Journal of Vacuum Science and Technology A, vol. 16, Sep./Oct. 1998, doi: 10.1116/1.581430, pp. 2845-2850.
Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.
Kerrigan, M.M., et al., "Low Temperature, Selective Atomic Layer Deposition of Cobalt Metal Films Using Bis(1,4-di-tert-butyl-1,3-diazadienyl)cobalt and Alkylamine Precursors," Chemistry of Materials, 2017, vol. 29(17), pp. 7458-7466.
Kerrigan, M.M., et al., "Low Temperature, Selective Atomic Layer Deposition of Nickel Metal Thin Films," ACS Applied Materials & Interfaces, 2018, vol. 10(16), pp. 14200-14208.
Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.
Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.
Klaus et al. (2000) "Atomically Controlled Growth of Tungsten and Tungsten Nitride Using Sequential Surface Reactions," Applied Surface Science, pp. 162-163, 479-491.
Knisley, T.J., et al., "Volatility and High Thermal Stability in Mid to Late First Row Transition Metal Diazadienyl Complexes," Organometallics, 2011, vol. 30(18), pp. 5010-5017.
Korean First Notification of Provisional Rejection, dated Dec. 8, 2010, issued in Application No. KR 2004-0036346.
Korean Office Action, dated Jun. 13, 2011, issued in Application No. KR 2011-0032098.
Korean Second Notification of Provisional Rejection, dated Aug. 25, 2011, issued in Application No. KR 2004-0036346.
KR Office Action dated Feb. 21, 2022, in Application No. KR10-2017-0102113 with English Translation.
KR Office Action dated Jan. 27, 2023 in Application No. KR10-2017-0102113 with English Translation.
KR Office Action dated May 30, 2022, in Application No. KR10-2019-7033130 With English Translation.
KR Office Action dated Oct. 27, 2022 in Application No. KR10-2022-7026373 with English translation.

(56) References Cited

OTHER PUBLICATIONS

KR Office Action dated Sep. 27, 2022, in Application No. KR10-2017-0102113 with English translation.
Kurek, A. et al., "Recent Advances Using Guanidinate Ligands for Chemical Vapour Deposition (CVD) and Atomic Layer Deposition (ALD) Applications," Australian Journal of Chemistry, Jun. 2014, vol. 67, pp. 989-996.
Lee, B. et al., "ALD Tungsten Solves Capacity Challenges in 3D NAND Device Manufacturing", Lam Brochure, Jan. 2019, pp. 1-4.
Li, Z. et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.
Lim, B. et al., "Atomic Layer Deposition of Transition Metals", Nature Materials, 2003, vol. 2, pp. 749-754.
Lin, S. et al., "Effect of Nitrogen on the Physical Properties and work Function of $MoN_x$ Cap Layers on $HfO_2$ Gate Dielectrics", ECS Journal of Solid State Science and Technology, 2014, vol. 3, No. 12, pp. N161-N165.
Majumder et al. "Investigation on the diffusion barrier properties of sputtered Mo/W-N thin films in Cu interconnects," Applied Physics Letters, vol. 91 (2007), pp. 162108-1-162108-3.
Makela, M., et al., "Thermal Atomic Layer Deposition of Continuous and Highly Conducting Gold Thin Films," Chemistry of Materials, 2017, vol. 29, pp. 6130-6136.
Mccain, M.N. et al., "Aerosol-Assisted Chemical Vapor Deposition of Lubricating MoS2 Films. Ferrous Substrates and Titanium Film Doping", Chemistry of Materials, 2008, vol. 20, No. 16, pp. 5438-5443.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A, 2019, vol. 37, No. 2, 021503, 6 pages.
Muhtade, M., et al., "Time Influence on Thickness and Grains for Molybdenum Thin Film," 2017, e-ISSN: 2289-8131, vol. 9, No. 2-13.
Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Notice of Allowance dated Apr. 27, 2020 issued in U.S. Appl. No. 16/676,169.
Notice of Allowance dated Aug. 6, 2019 issued in U.S. Appl. No. 15/948,143.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action Requirement for Restriction/Election dated Sep. 22, 2021 issued in U.S. Appl. No. 17/250,452.
Otsuka, S. et al., "A Novel Molybdenum Thiolato Compound, Tetrakis(tert-butylthiolato)molybdenum(IV). Preparation and Crystal and Molecular Structure" Journal of American chemistry society, 1981, vol. 103, pp. 3011-3014.
Ouyang, T., et al., "A Surface Chemistry Route to Molybdenum Sulfide and Germanide Films Using the Single-Source Precursor Tetrakis(diethylaminodithiocarbomato)molybdate(IV)," The Journal of Physical Chemistry B, 2004, vol. 108(5), pp. 17537-17545.
PCT Search Report and Written Opinion, dated Jan. 19, 2005, issued in PCT/US2004/006940.

Ranade, P. et al., "Work Function Engineering of Molybdenum Gate Electrodes by Nitrogen Implantation", Electrochemical and Solid-State Letters, 2001, vol. 4, No. 11, pp. G85-G87.
Seghete, D et al., Molybdenum Atomic Layer Deposition Using MoF6 and Si2H6 As the Reactants, Chemistry of Materials, 2011, vol. 23 No. 7, pp. 1668-1678.
SG Search Report and Written Opinion dated Feb. 10, 2023 in Application No. SG11202109796Q.
Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.
Singapore Written Opinion dated Mar. 15, 2023 issued in Application No. SG11202108217U.
Specification of U.S. Appl. No. 62/425,704, (Electronically filed Nov. 23, 2016).
TW Office Action dated Aug. 16, 2022, in Application No. TW107141042 with English translation.
TW Office Action dated Feb. 10, 2023 in Application No. TW107112210 with English translation.
TW Office Action dated Feb. 23, 2023 in Application No. TW108126326 with English translation.
TW Office Action dated May 24, 2022, in Application No. TW20180112210 with English translation.
TW Office Action dated Oct. 18, 2021, in application No. TW107112210 with English translation.
TW Office Action dated Sep. 14, 2022, in Application No. TW107112210 with English translation.
U.S Advisory Action dated May 3, 2022 in U.S. Appl. No. 16/764,812.
U.S. Advisory Action dated Oct. 18, 2022, in U.S. Appl. No. 17/250,452.
U.S. Corrected Notice of Allowance dated Feb. 16, 2022, in U.S. Appl. No. 16/724,231.
U.S. Corrected Notice of Allowance dated May 11, 2022, in U.S. Appl. No. 16/724,231.
U.S. Final office Action dated Jul. 25, 2022 in U.S. Appl. No. 17/250,452.
U.S. Final Office Action dated Feb. 2, 2023 in U.S. Appl. No. 17/436,944.
U.S. Final Office Action dated Jan. 31, 2022 in U.S. Appl. No. 16/764,812.
US Final Office Action, dated Jul. 14, 2005, issued in U.S. Appl. No. 10/649,351.
U.S. Final office Action dated Jun. 26, 2023 in U.S. Appl. No. 17/589,416.
U.S. Final Office Action dated Mar. 1, 2023 in U.S. Appl. No. 17/250,452.
US Final Office Action dated Mar. 29, 2021 issued in U.S. Appl. No. 16/724,231.
U.S. Final Office Action dated May 31, 2023, in U.S. Appl. No. 17/814,207.
U.S. Final Office Action dated Nov. 30, 2022 in U.S. Appl. No. 16/764,812.
U.S. Non Final Office Action dated Mar. 21, 2022, in U.S. Appl. No. 17/250,452.
U.S. Non-Final Office Action dated Dec. 15, 2021 in U.S. Appl. No. 17/250,014.
U.S. Non-Final Office Action dated Feb. 2, 2023 in U.S. Appl. No. 17/589,416.
U.S. Non-Final Office Action dated Feb. 2, 2023 in U.S. Appl. No. 17/662,220.
U.S. Non-Final Office Action dated Jul. 20, 2023, in U.S. Appl. No. 17/814,209.
U.S. Non-Final Office Action dated Jun. 20, 2023, in U.S. Appl. No. 17/250,452.
U.S. Non-Final Office Action dated Jun. 24, 2022, in U.S. Appl. No. 17/436,944.
U.S. Non-Final Office Action dated May 16, 2022 in U.S. Appl. No. 16/764,812.
U.S. Non-Final Office Action dated Nov. 19, 2021, in U.S. Appl. No. 17/250,452.
U.S. Non-Final Office Action dated Nov. 30, 2022 in U.S. Appl. No. 17/814,207.

(56) References Cited

OTHER PUBLICATIONS

U.S. Notice of Allowance dated Feb. 2, 2022 in U.S. Appl. No. 16/724,231.
U.S. Notice of Allowance dated Jul. 14, 2023 in U.S. Appl. No. 17/436,944.
US Notice of Allowance, dated Jul. 21, 2006, issued in U.S. Appl. No. 10/649,351.
U.S. Notice of Allowance dated Jun. 7, 2022 in U.S. Appl. No. 17/250,014.
U.S. Notice of Allowance dated Sep. 16, 2022 in U.S. Appl. No. 17/250,014.
US Notice of allowance dated Sep. 29, 2021 issued in U.S. Appl. No. 16/724,231.
US Office Action, dated Dec. 30, 2005, issued in U.S. Appl. No. 10/649,351.
US Office Action, dated Feb. 8, 2005, issued in U.S. Appl. No. 10/649,351.
US Office Action dated Sep. 22, 2020 issued in U.S. Appl. No. 16/724,231.
US Office Action Restriction/Election dated Sep. 9, 2021 issued in U.S. Appl. No. 17/250,014.
U.S. Appl. No. 17/999,255, inventors Tarafdar et al., filed Nov. 18, 2023.
U.S. Appl. No. 62/362,582, inventors Meng et al., filed Jul. 14, 2016.
U.S. Supplemental Notice of Allowance dated Dec. 14, 2022 in U.S. Appl. No. 17/250,014.
Zhao, Y., et al., "Synthesis and Structures of Mono- and Dinuclear Molybdenum Complexes with Reduced α-Diimine Ligands," European Journal of Inorganic Chemistry, 2016, pp. 5411-5417.
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
CN Office Action dated Dec. 28, 2023 in CN Application No. 202080059499.7 with English Translation.
CN Office Action dated Feb. 28, 2024 in CN Application No. 201980051278.2, with English Translation.
CN Office Action dated Jan. 18, 2024 in CN Application No. 202080020646.X with English translation.
CN Office Action dated Jul. 9, 2024 in CN Application No. 201980049916.7 with English translation.
CN Office Action dated Jun. 7, 2024 in CN Application No. 201880074995.2, with English Translation.
CN Office Action dated Jun. 27, 2024 in CN Application No. 201980076277.3 with English translation.
CN Office Action dated May 31, 2024 in CN Application No. 201980038600.8 with English translation.
CN Office Action dated Sep. 24, 2023, in Application No. CN202080020646.X with English translation.
CN Office Action dated Sep. 28, 2023, in application No. CN201980049916.7 with English translation.
EP Extended European Search report dated Dec. 14, 2023, in Application No. EP20854552.5.
EP Partial Supplementary European Search report dated Sep. 13, 2023, in Application No. EP20854552.5.
Gall D., "Electron Mean Free Path in Elemental Metals," Journal of Applied Physics, Feb. 23, 2016, vol. 119, 6 Pages.
International Preliminary Report on Patentability and Written Opinion dated Jun. 27, 2024 in PCT Application No. PCT/US2022/080705.
International Preliminary Report on Patentability and Written Opinion dated Jun. 27, 2024 in PCT Application No. PCT/US2022/080863.
International Preliminary Report on Patentability and Written Opinion dated Nov. 23, 2023 in PCT Application No. PCT/US2022/028845.
International Preliminary Report on Patentability and Written Opinion dated Sep. 6, 2024 in PCT Application No. PCT/US2023/062877.
International Preliminary Report on Patentability dated Jul. 20, 2023, in PCT Application No. PCT/US2022/011053.
International Preliminary Report on Patentability dated Jun. 1, 2023, in Application No. PCT/US2021/058099.
International Preliminary Report on Patentability dated Oct. 26, 2023, in PCT Application No. PCT/US2022/024295.
International Preliminary Report on Patentability dated Sep. 7, 2023, in PCT Application No. PCT/US2022/017005.
International Search Report and Written Opinion dated Apr. 25, 2022, for International Application No. PCT/US2022/011053.
International Search Report and Written Opinion dated Aug. 2, 2022 in Application No. PCT/US2022/024295.
International Search Report and Written Opinion dated Aug. 11, 2023, in Application No. PCT/US2023/019795.
International Search Report and Written Opinion dated Aug. 16, 2023, in Application No. PCT/US2023/017635.
International Search Report and Written Opinion dated Aug. 16, 2023, in Application No. PCT/US2023/019800.
International Search Report and Written Opinion dated Aug. 16, 2023, in Application No. PCT/US2023/019000.
International Search Report and Written Opinion dated Feb. 7, 2024 in PCT Application No. PCT/US2023/034858.
International Search Report and Written Opinion dated Feb. 16, 2024 in PCT Application No. PCT/US2023/035873.
International Search Report and Written Opinion dated Jul. 23, 2024 in PCT Application No. PCT/US2024/023361.
International Search Report and Written Opinion dated Mar. 3, 2022, in Application No. PCT/US2021/058099.
International Search Report and Written Opinion dated Oct. 17, 20223 in PCT Application No. PCT/US2023/069018.
International Search Report and Written Opinion dated Sep. 6, 2023, in Application No. PCT/US2023/023023.
Jang, Y., et al., "Highly-conformal Nanocrystalline Molybdenum Nitride Thin Films by Atomic Layer Deposition as a Diffusion Barrier Against Cu," Journal of Alloys and Compounds, 2016, vol. 663, pp. 651-658.
JP Notice of Allowances dated Oct. 1, 2024 in JP Application No. 2021-543355 with English translation.
JP Office Action dated Aug. 6, 2024 in JP Application No. 2023-547183, with English Translation.
JP Office Action dated Aug. 20, 2024 in JP Application No. 2022-514153, with English Translation.
JP Office Action dated Dec. 12, 2023 in JP Application No. 2021-527153 with English Translation.
JP Office Action dated Dec. 26, 2023, in application No. JP20220141888 with English translation.
JP Office Action dated Feb. 6, 2024 in JP Application No. 2021-543355 with English translation.
JP Office Action dated Feb. 20, 2024 in JP Application No. 2023-547183 with English translation.
JP Office Action dated Feb. 27, 2024 in Application No. JP2022-522581 with English Translation.
JP Office Action dated Jul. 16, 2024 in JP Application No. 2021-527153, with English Translation.
JP Office Action dated Jun. 11, 2024 in JP Application No. 2023-95239, with English Translation.
JP Office Action dated Mar. 5, 2024 in JP Application No. 2022-141887, with English Translation.
JP Office Action dated Mar. 19, 2024 in JP Application No. 2020-561743, with English Translation.
JP Office Action dated Mar. 26, 2024 in JP Application No. 2022-524041 with English translation.
JP Office Action dated Oct. 3, 2023 in Application No. JP2022-522581 with English Translation.
JP Office Action dated Oct. 3, 2023 in Application No. JP2023-95239 with English Translation.
JP Office Action dated Sep. 3, 2024 in JP Application No. 2022-141888 with English translation.
JP Office Action dated Sep. 3, 2024 in JP Application No. 2022-509591, with English Translation.
JP Office Action dated Sep. 5, 2023, in Application No. JP2022-145721 with English translation.

(56) References Cited

OTHER PUBLICATIONS

KR Notice of Allowances dated Aug. 28, 2024 in KR Application No. 10-2023-7028915 with English Translation.
KR Office Action dated Dec. 15, 2023 in KR Application No. 10-2023-7028915, with English Translation.
KR Office Action dated Jul. 28, 2023, in Application No. KR10-2023-0081299 with English Translation.
KR Office Action dated Jun. 27, 2024 in KR Application No. 10-2023-0081299, with English Translation.
KR Office Action dated Mar. 1, 2024 in KR Application No. 10-2021-7018803, with English Translation.
KR Office Action dated Mar. 29, 2024 in KR Application No. 10-2020-7017697 with English translation.
KR Office Action dated May 7, 2024 in KR Application No. 10-2020-7034800, with English Translation.
KR Office Action dated May 28, 2024 in KR Application No. 10-2021-7006202 with English translation.
KR Office Action dated Nov. 14, 2023, in KR Application No. 10-2022-7031314 with English Translation.
KR Office Action dated Sep. 26, 2024 in KR Application No. 10-2022-7031314, with English Translation.
Pol, V. G., et al., "Fabrication of Magnetic Nanoparticles Using Rapet Technique With or Without Employing External Magnetic Field," The Journal of Physical Chemistry C, 2008, vol. 112, pp. 6627-6637.
Qu Jingxin, et al., "Surface Engineering Handbook," Chemical Industry Publishing House, Mar. 31, 1998, p. 277.
SG Office Action dated Oct. 11, 2023, in application No. SG11202201453T.
SG Office Action dated Sep. 19, 2023, in application No. SG11202202087P.
SG Search Report and Written Opinion dated Aug. 22, 2024 in SG Application No. 11202203845Q.
SG Written Opinion dated Oct. 4, 2023 in Application No. SG11202109796Q.
Shirazi, M., et al., "Initial Stage of Atomic Layer Deposition of 2D-MoS$_2$ on a SiO$_2$ surface: a DFT study," Physical Chemistry Chemical Physics, 2018, vol. 20 (24), pp. 1-18.
Stephenson T A., et al., "487. Molybdenum(II) Carboxylates," Journal of the Chemical Society, 1964, pp. 2538-2541.
Sun Yicai, et al., "Design Manufacturing and Application," Metallurgical Industry Publishing House, Apr. 30, 2000, p. 166.
TW Office Action dated Apr. 24, 2024 in TW Application No. 109130013, With English Translation.
TW Office Action dated Aug. 31, 2023, in Application No. TW109102778 with English translation.
TW Office Action dated Dec. 5, 2023 in TW Application No. 109107661 with English translation.
TW Office Action dated Dec. 21, 2023 in Application No. TW108126326 with English translation.
TW Office Action dated May 9, 2024 in TW Application No. 109107661 with English translation.
TW Office Action dated May 22, 2024 in TW Application No. 109135654, with English Translation.
TW Office Action dated Oct. 19, 2023 in Application No. TW107112210 with English translation.
U.S. Corrected Notice of Allowance dated May 15, 2024 in U.S. Appl. No. 17/250,503.
U.S. Final Office Action dated Apr. 12, 2024 in U.S. Appl. No. 17/814,206.
U.S. Final Office Action dated Feb. 12, 2024 in U.S. Appl. No. 17/589,416.
U.S. Final Office Action dated May 8, 2024 in U.S. Appl. No. 17/250,452.
U.S. Final Office Action dated May 9, 2024 in U.S. Appl. No. 17/814,207.
U.S. Final Office Action dated Oct. 10, 2024 in U.S. Appl. No. 18/379,397.
U.S. Final office Action dated Sep. 14, 2023 in U.S. Appl. No. 17/662,220.
U.S. Non-Final Office Action dated Aug. 7, 2024 in U.S. Appl. No. 18/310,523.
U.S. Non-Final Office Action dated Aug. 29, 2023, in U.S. Appl. No. 17/310,293.
U.S. Non-Final Office Action dated Aug. 31, 2023, in U.S. Appl. No. 17/250,503.
U.S. Non-Final Office Action dated Feb. 29, 2024 in U.S. Appl. No. 17/294,378.
U.S. Non-Final Office Action dated Jan. 17, 2024 in U.S. Appl. No. 17/814,207 .
U.S. Non-Final Office Action dated Jun. 21, 2024 in U.S. Appl. No. 17/639,846.
U.S. Non-Final Office Action dated Jun. 21, 2024 in U.S. Appl. No. 18/379,397.
U.S. Non-Final Office Action dated May 23, 2024 in U.S. Appl. No. 17/662,220.
U.S. Non-Final Office Action dated Nov. 6, 2023, in U.S. Appl. No. 17/814,206.
U.S. Non-Final Office Action dated Nov. 30, 2023 in U.S. Appl. No. 17/250,452.
U.S. Non-Final Office Action dated Oct. 26, 2023, in U.S. Appl. No. 17/589,416.
U.S. Non-Final Office Action dated Sep. 5, 2024 in U.S. Appl. No. 17/814,206.
U.S. Notice of Allowance dated Apr. 4, 2024 in U.S. Appl. No. 17/310,293.
U.S. Notice of Allowance dated Aug. 3, 2023, in U.S. Appl. No. 17/436,944.
U.S. Notice of Allowance dated Feb. 7, 2024 in U.S. Appl. No. 17/250,503.
U.S. Notice of Allowance dated Jan. 2, 2024 in U.S. Appl. No. 17/310,293.
U.S. Notice of Allowance dated Jul. 3, 2024 in U.S. Appl. No. 17/294,378.
U.S. Notice of Allowance dated Mar. 27, 2024 in U.S. Appl. No. 17/814,209.
U.S. Notice of Allowance dated Nov. 14, 2023 in U.S. Appl. No. 17/814,209.
U.S. Notice of Allowance dated Oct. 4, 2023, in U.S. Appl. No. 17/436,944.
U.S. Appl. No. 18/253,038, inventors Lai C.S, et al., filed May 16, 2023.
U.S. Appl. No. 18/286,994, inventors Thombare S V, et al., filed Oct. 13, 2023.
U.S. Appl. No. 18/559,783, inventor Bhadauriya S, filed Nov. 23, 2023.
U.S. Appl. No. 18/714,506, inventors Mandia D.J., et al., filed May 29, 2024.
U.S. Appl. No. 18/716,846, inventors Mandia D.J, et al., filed Jun. 5, 2024.
U.S. Appl. No. 18/799,905, inventors Thombare S.V, et al., filed Aug. 9, 2024.
U.S. Appl. No. 18/837,560, inventors Hsieh Y, et al., filed Aug. 9, 2024.
U.S. Restriction requirement dated May 13, 2024, in U.S. Appl. No. 18/310,523.
Werndrup P., et al., A Single-source-precursor Approach to Late Transition Metal Molybdate Materials: the Structural Role of Chelating Ligands in the Formation of Heterometallic Heteroleptic Alkoxide Complexes, European Journal of Inorganic Chemistry, 2006, vol. 2006 (7), 1413-1422.
CN Office Action dated Nov. 22, 2024 in CN Application No. 201980051278.2, with English Translation.
CN Office Action dated Nov. 29, 2024 in CN Application No. 201880074995.2, with English Translation.
CN Office Action dated Oct. 17, 2024 in CN Application No. 202080059499.7 with English translation.
International Preliminary Report on Patentability and Written Opinion dated Jan. 2, 2025 in PCT Application No. PCT/US2023/069018.
International Preliminary Report on Patentability and Written Opinion dated Nov. 14, 2024 in PCT Application No. PCT/US2023/019795.

(56) References Cited

OTHER PUBLICATIONS

International Preliminary Report on Patentability and Written Opinion dated Oct. 17, 2024 in PCT Application No. PCT/US2023/017635.
International Preliminary Report on Patentability and Written Opinion dated Oct. 31, 2024 in PCT Application No. PCT/US2023/019000.
International Preliminary Report on Patentability and Written Opinion dated Dec. 5, 2024 in PCT Application No. PCT/US2023/023023.
International Preliminary Report on Patentability and Written Opinion dated Nov. 7, 2024 in PCT Application No. PCT/US2023/019800.
International Search Report and Written Opinion dated Oct. 22, 2024 in PCT Application No. PCT/US2024/037234.
JP Notice of Allowances dated Oct. 15, 2024 in JP Application No. 2021-552861 with English translation.
JP Office Action dated Jan. 7, 2025 in JP Application No. 2021-527153 with English translation.
JP Office Action dated Jan. 28, 2025 in JP Application No. 2022-571128, with English Translation.
JP Office Action dated Nov. 12, 2024 in JP Application No. 2022-522581 with English translation.
JP Office Action dated Oct. 29, 2024 in JP Application No. 2022-141887 with English translation.
KR Notice of Allowance dated Nov. 25, 2024 in KR Application No. 10-2023-0081299, with English Translation.
KR Notice of Allowances dated Jan. 8, 2025 in KR Application No. 10-2022-7031314 with English Translation.
KR Office Action dated Dec. 3, 2024 in KR Application No. 10-2021-7032632 with English Translation.
KR Office Action dated Dec. 20, 2024 in KR Application No. 10-2022-7015736, with English Translation.
KR Office Action dated Dec. 31, 2024 in KR Application No. 10-2021-7006202, with English Translation.
KR Office Action dated Nov. 21, 2024 in KR Application No. 10-2021-7005949 with English Translation.
KR Office Action dated Oct. 28, 2024 in KR Application No. 10-2021-7018803 with English Translation.
SG Written Opinion dated Jan. 9, 2025 in SG Application No. 11202202087P.
U.S. Final Office Action dated Feb. 4, 2025 in U.S. Appl. No. 18/310,523.
U.S. Final Office Action dated Jan. 3, 2025 in U.S. Appl. No. 17/662,220.
U.S. Final Office Action dated Nov. 22, 2024 in U.S. Appl. No. 17/639,846.
U.S. Appl. No. 18/852,644, inventors Austin D.Z et al., filed Sep. 30, 2024.
U.S. Appl. No. 18/857,125, inventors Griffiths M.B, et al., filed Oct. 15, 2024.
U.S. Appl. No. 18/859,971, inventors Mahenderkar N.K, et al., filed Oct. 24, 2024.
U.S. Appl. No. 18/866,057, inventors Wongsenakhum P, et al., filed Nov. 14, 2024.
U.S. Appl. No. 18/877,501, inventors Fox A.R et al., filed Dec. 20, 2024.

\* cited by examiner

FIG. 2B  FIG. 2C

MOLYBDENUM FILL

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes.

BACKGROUND

Deposition of materials including tungsten-containing materials is an integral part of many semiconductor fabrication processes. These materials may be used for horizontal interconnects, vias between adjacent metal layers, and contacts between metal layers and devices. In an example of deposition, a tungsten layer may be deposited on a titanium nitride (TiN) barrier layer to form a TiN/W bilayer by a CVD process using $WF_6$. However, as devices shrink and more complex patterning schemes are utilized in the industry, deposition of thin tungsten films becomes a challenge. The continued decrease in feature size and film thickness bring various challenges to TiN/W film stacks. These include high resistivity for thinner films and deterioration of TiN barrier properties. Deposition in complex high aspect ratio structures such as 3D NAND structures is particularly challenging.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

One aspect of the disclosure relates to a method including providing a substrate including one or more features, each of the one or more feature having at least one opening and an interior region fluidically accessible through the at least one opening; depositing a first layer of molybdenum in the one or more features; and treating the first layer non-conformally such that that the treatment is preferentially applied at portions of the first layer near the at least one opening of the one or more features relative to portions of the first layer that are further in the interior region of the feature.

In some embodiments, treating the first layer non-conformally includes inhibiting the first layer non-conformally. In some embodiments, treating the first layer non-conformally includes etching the first layer non-conformally.

In some embodiments, treating the first layer is performed during depositing the first layer of molybdenum. In some such embodiments, the method includes exposing the one or more features to a molybdenum precursor under conditions such that the precursor flux or concentration is nearer the at least one opening of the one or more features. In some such embodiments, the molybdenum precursor is a molybdenum oxyhalide. In some such embodiments, the molybdenum oxyhalide has a lower growth rate near the one or more openings of the one or more features than in the interior region due to etch reactions. In some such embodiments, the molybdenum oxyhalide has a lower growth rate near the one or more openings of the one or more features than in the interior region due to an inhibition treatment.

In some embodiments, treating the first layer is performed after the first layer of molybdenum is deposited.

In some embodiments, treating the first layer includes exposing it to an inhibition chemistry. In some embodiments, the inhibition chemistry is a nitrogen-containing chemistry. In some such embodiments, treating the first layer includes, after exposing it to a nitrogen-containing chemistry, exposing it to one or more of hydrogen gas and a molybdenum precursor.

In some embodiments, treating the first layer includes exposing it to an etch chemistry. In some such embodiments, wherein the etch chemistry is a halogen-containing chemistry. In some such embodiments, the first layer includes, after exposing it to a halogen-containing chemistry, purging a chamber housing the substrate.

In some embodiments, treating the first layer includes exposing it to a nitrogen-containing compound. In some embodiments, treating the first layer includes exposing it to a halogen-containing compound. In some embodiments, treating the first layer includes exposing it to ammonia or nitrogen trifluoride. In some embodiments, treating the first layer is a non-plasma thermal process. In some embodiments, treating the first layer is a plasma process.

In any of the above methods, depositing the first layer of molybdenum may include an atomic layer deposition process using $H_2$ as a reducing agent for a molybdenum oxyhalide or molybdenum halide precursor.

In any of the above methods, the method may further include, after treating the first layer non-conformally, further including depositing a second layer of molybdenum. In some such embodiments, depositing the second layer includes an atomic layer deposition process using $H_2$ as a reducing agent for a molybdenum oxyhalide or molybdenum halide precursor.

According to various embodiments, the substrate includes a 3-D structure having sidewalls, wherein the one or more openings of the one or more features are openings in the sidewalls. According to various embodiments, the one or more features have a closed end.

Another aspect of the disclosure relates to a method including: depositing a conformal layer of a molybdenum (Mo) in a feature using a Mo precursor at first Mo precursor flow rate, Mo precursor partial pressure, and Mo precursor dose time; and increasing at least one of Mo precursor flow rate, Mo precursor partial pressure, and Mo precursor dose time to increase the Mo precursor flux at the feature opening, to thereby deposit a second layer of Mo on the conformal layer of Mo. In some such embodiments, the Mo precursor is a molybdenum oxychloride.

Another aspect of the disclosure relates to an apparatus including: a process chamber having one or more stations each configured to hold a substrate; one or more process gas inlets for coupling to a hydrogen ($H_2$) gas source, a molybdenum precursor gas source, an inert purge gas source, and a treatment gas source; and a controller for controlling operations in the apparatus, including machine-readable instructions for: (a) alternating $H_2$ and molybdenum precursor pulses into the process chamber via the one or more process gas inlets to deposit a first molybdenum layer on a substrate; (b) after (a), inletting a treatment gas to treat the first molybdenum layer; and (c) after (b), alternating $H_2$ and molybdenum precursor pulses into the process chamber via the one or more process gas inlets to deposit a first molybdenum layer on a substrate.

Yet another aspect of the disclosure relates to an apparatus including a process chamber having one or more stations each configured to hold a substrate; one or more process gas inlets for coupling to a hydrogen (H₂) gas source, a molybdenum precursor gas source, an inert purge gas source, and a treatment gas source; and a controller for controlling operations in the apparatus, including machine-readable instructions for: (a) inletting H₂ and molybdenum precursor into the process chamber via the one or more process gas inlets to deposit a first molybdenum layer on a substrate; and (b) after (a), changing one or more of Mo precursor flow rate or dose time to deposit a first molybdenum layer on a substrate.

These and other aspects are described further below with reference to the Figures.

BRIEF DESCRIPTION OF DRAWINGS

FIGS. 2A-2J are schematic examples of various structures into which molybdenum may be deposited in accordance with disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Figure 1A:
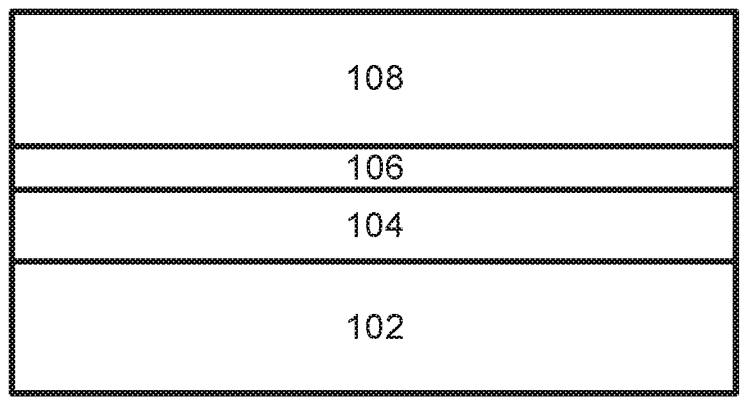
FIGS. 1A and 1B are schematic examples of material stacks that include molybdenum (Mo) according to various embodiments.
Figure 1B:
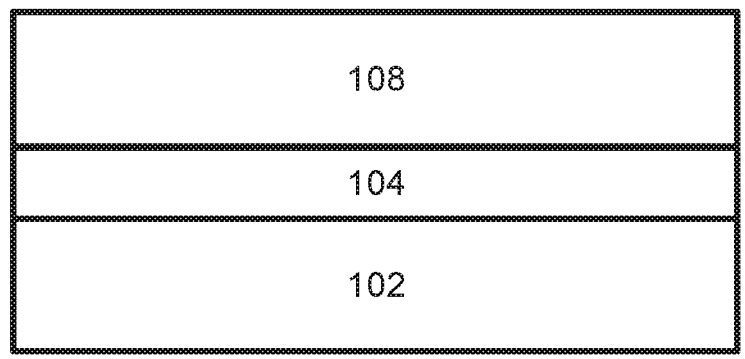

Provided herein are methods of filling features molybdenum (Mo) with that may be used for logic and memory applications. FIGS. 1A and 1B are schematic examples of material stacks that include Mo according to various embodiments. FIGS. 1A and 1B illustrate the order of materials in a particular stack and may be used with any appropriate architecture and application, as described further below with respect to FIGS. 2A-2J. In the example of FIG. 1A, a substrate 102 has a Mo layer 108 is deposited thereon. The substrate 102 may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods may also be applied to form metallization stack structures on other substrates, such as glass, plastic, and the like.

In FIG. 1A, a dielectric layer 104 is on the substrate 102. The dielectric layer 104 may be deposited directly on a semiconductor (e.g., Si) surface of the substrate 102, or there may be any number of intervening layers. Examples of dielectric layers include doped and undoped silicon oxide, silicon nitride, and aluminum oxide layers, with specific examples including doped or undoped layers SiO₂ and Al₂O₃. Also, in FIG. 1A, a diffusion barrier layer 106 is disposed between the Mo layer 108 and the dielectric layer 104. Examples of diffusion barrier layers including titanium nitride (TiN), titanium/titanium nitride (Ti/TiN), tungsten nitride (WN), and tungsten carbon nitride (WCN). Further examples diffusion barriers are multi-component Mo-containing films as described further below. The Mo layer 108 is the main conductor of the structure. In some embodiments, the Mo layer 108 may include multiple bulk layers deposited at different conditions. The Mo layer 108 may or may not include a Mo nucleation layer. Further, in some embodiments, the Mo layer 108 may be deposited on growth initiation layer that includes another material, such as a tungsten (W) or W-containing growth initiation layer.

FIG. 1B shows another example of a material stack. In this example, the stack includes the substrate 102, dielectric layer 104, with Mo layer 108 deposited directly on the dielectric layer 104, without an intervening diffusion barrier layer. The Mo layer 108 is as described with respect to FIG. 1A. By using Mo, which has a lower electron mean free path than W, as the main conductor, lower resistivity thin films can be obtained.

While FIGS. 1A and 1B show examples of metallization stacks, the methods and resulting stacks are not so limited. For example, in some embodiments, Mo may be deposited directly on a Si or other semiconductor substrate, with or without an initiation layer. FIGS. 1A and 1B illustrate examples of order of materials in a particular stack and may be used with any appropriate architecture and application, as described further below with respect to FIGS. 2A-2J.

The methods described herein are performed on a substrate that may be housed in a chamber. The substrate may be a silicon or other semiconductor wafer, e.g., a 200-mm wafer, a 300-mm wafer, or a 450-mm wafer, including wafers having one or more layers of material, such as dielectric, conducting, or semi-conducting material deposited thereon. The methods are not limit to semiconductor substrates, and may be performed to fill any feature with molybdenum.

Substrates may have features such as via or contact holes, which may be characterized by one or more of narrow and/or re-entrant openings, constrictions within the feature, and high aspect ratios. A feature may be formed in one or more of the above described layers. For example, the feature may be formed at least partially in a dielectric layer. In some embodiments, a feature may have an aspect ratio of at least about 2:1, at least about 4:1, at least about 6:1, at least about 10:1, at least about 25:1, or higher. One example of a feature is a hole or via in a semiconductor substrate or a layer on the substrate.

Figure 2A:
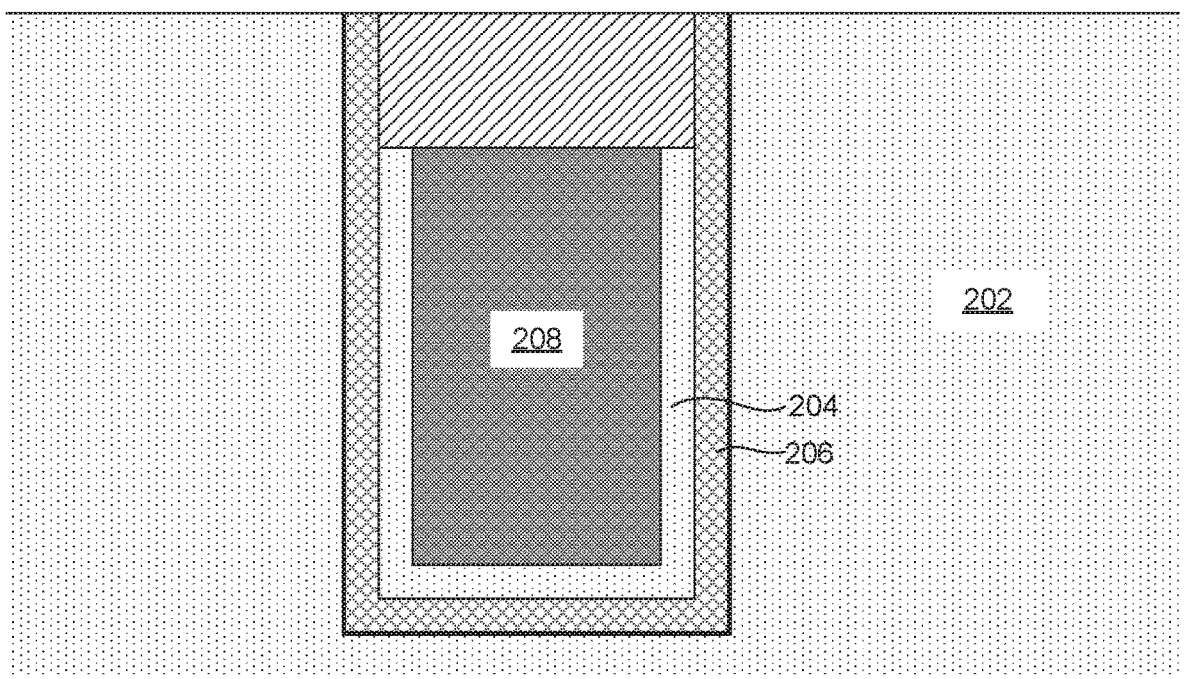

FIG. 2A depicts a schematic example of a DRAM architecture including a Mo buried wordline (bWL) 208 in a silicon substrate 202. The Mo bWL is formed in a trench etched in the silicon substrate 202. Lining the trench is a conformal barrier layer 206 and an insulating layer 204 that is disposed between the conformal barrier layer 206 and the silicon substrate 202. In the example of FIG. 2, the insulating layer 204 may be a gate oxide layer, formed from a high-k dielectric material such as a silicon oxide or silicon nitride material. In some embodiments disclosed herein the conformal barrier layer is TiN or tungsten-containing layer such as WN or WCN. In some embodiments, it TiN is used as a barrier, a conformal tungsten-containing growth initiation layer may be present between the conformal barrier layer 206 and the Mo bWL 208. Alternatively, the Mo bWL 208 may be deposited directly on a TiN or other diffusion barrier. In some embodiments, one or both of layers 204 and 206 is not present.

The bWL structure shown in FIG. 2A is one example of an architecture that includes a Mo fill layer. During fabrication of the bWL, Mo is deposited into a feature that may be defined by an etched recess in the silicon substrate 202 that is conformally lined with layers 206 and 204, if present.

FIGS. 2B-2H are additional schematic examples of various structures into which Mo may be deposited in accordance with disclosed embodiments. FIG. 2B shows an example of a cross-sectional depiction of a vertical feature 201 to be filled with Mo. The feature can include a feature hole 205 in a substrate 202. The hole 205 or other feature may have a dimension near the opening, e.g., an opening diameter or line width of between about 10 nm to 500 nm, for example between about 25 nm and about 300 nm. The feature hole 205 can be referred to as an unfilled feature or simply a feature. The feature 201, and any feature, may be characterized in part by an axis 218 that extends through the length of the feature, with vertically-oriented features having vertical axes and horizontally-oriented features having horizontal axes.

In some embodiments, features are wordline features in a 3D NAND structure. For example, a substrate may include a wordline structure having an arbitrary number of wordlines (e.g., 50 to 150) with vertical channels at least 200 Å deep. Another example is a trench in a substrate or layer. Features may be of any depth. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

FIG. 2C shows an example of a feature 201 that has a re-entrant profile. A re-entrant profile is a profile that narrows from a bottom, closed end, or interior of the feature to the feature opening. According to various implementations, the profile may narrow gradually and/or include an overhang at the feature opening. FIG. 2C shows an example of the latter, with an under-layer 213 lining the sidewall or interior surfaces of the feature hole 105. The under-layer 213 can be for example, a diffusion barrier layer, an adhesion layer, a nucleation layer, a combination of thereof, or any other applicable material. Non-limiting examples of under-layers can include dielectric layers and conducting layers, e.g., silicon oxides, silicon nitrides, silicon carbides, metal oxides, metal nitrides, metal carbides, and metal layers. In particular implementations an under-layer can be one or more of titanium, titanium nitride, tungsten nitride, titanium aluminide, tungsten, and molybdenum. In some embodiments, the under-layer is tungsten-free. In some embodiments, the under-layer is molybdenum-free. The under-layer 213 forms an overhang 215 such that the under-layer 213 is thicker near the opening of the feature 201 than inside the feature 201.

Figure 2E:
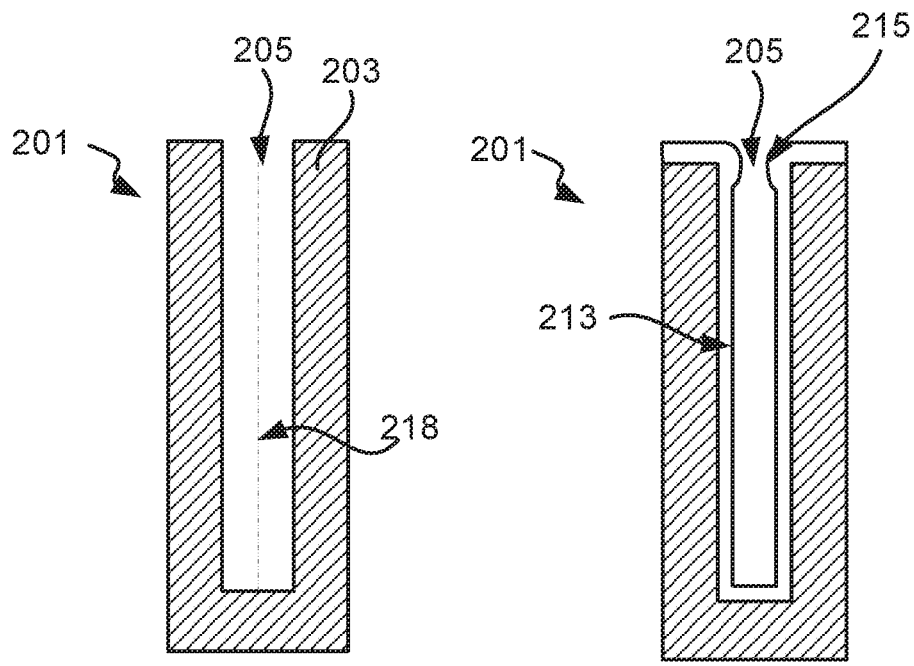
Figure 2E:
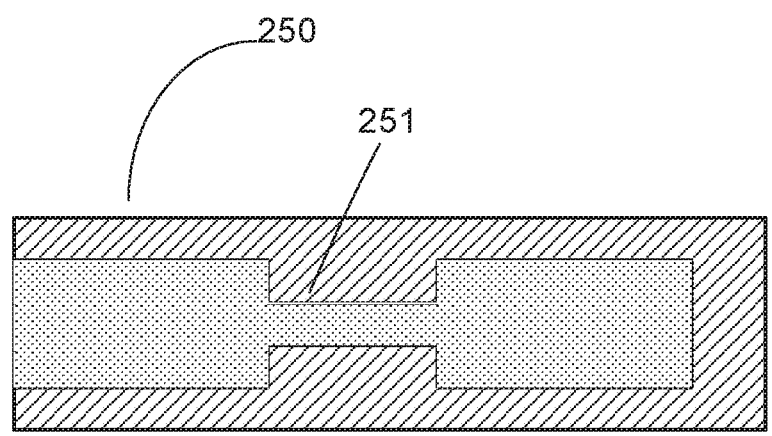
Figure 2D:
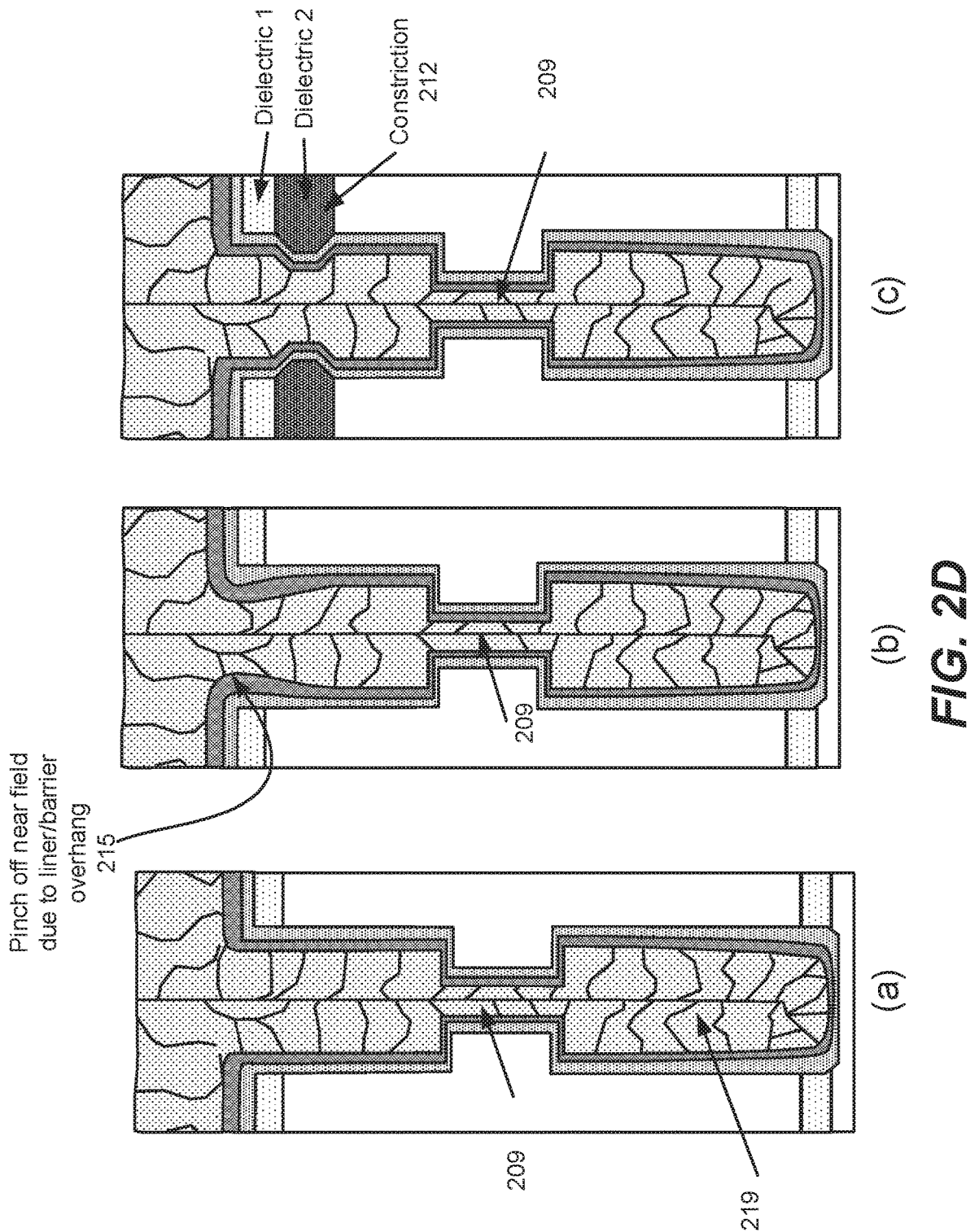

In some implementations, features having one or more constrictions within the feature may be filled. FIG. 2D shows examples of views of various filled features having constrictions. Each of the examples (a), (b) and (c) in FIG. 2D includes a constriction 209 at a midpoint within the feature. The constriction 209 can be, for example, between about 15 nm-20 nm wide. Constrictions can cause pinch off during deposition of tungsten or molybdenum in the feature using conventional techniques, with deposited metal blocking further deposition past the constriction before that portion of the feature is filled, resulting in voids in the feature. Example (b) further includes a liner/barrier overhang 215 at the feature opening. Such an overhang could also be a potential pinch-off point. Example (c) includes a constriction 212 further away from the field region than the overhang 215 in example (b).

Figure 2F:
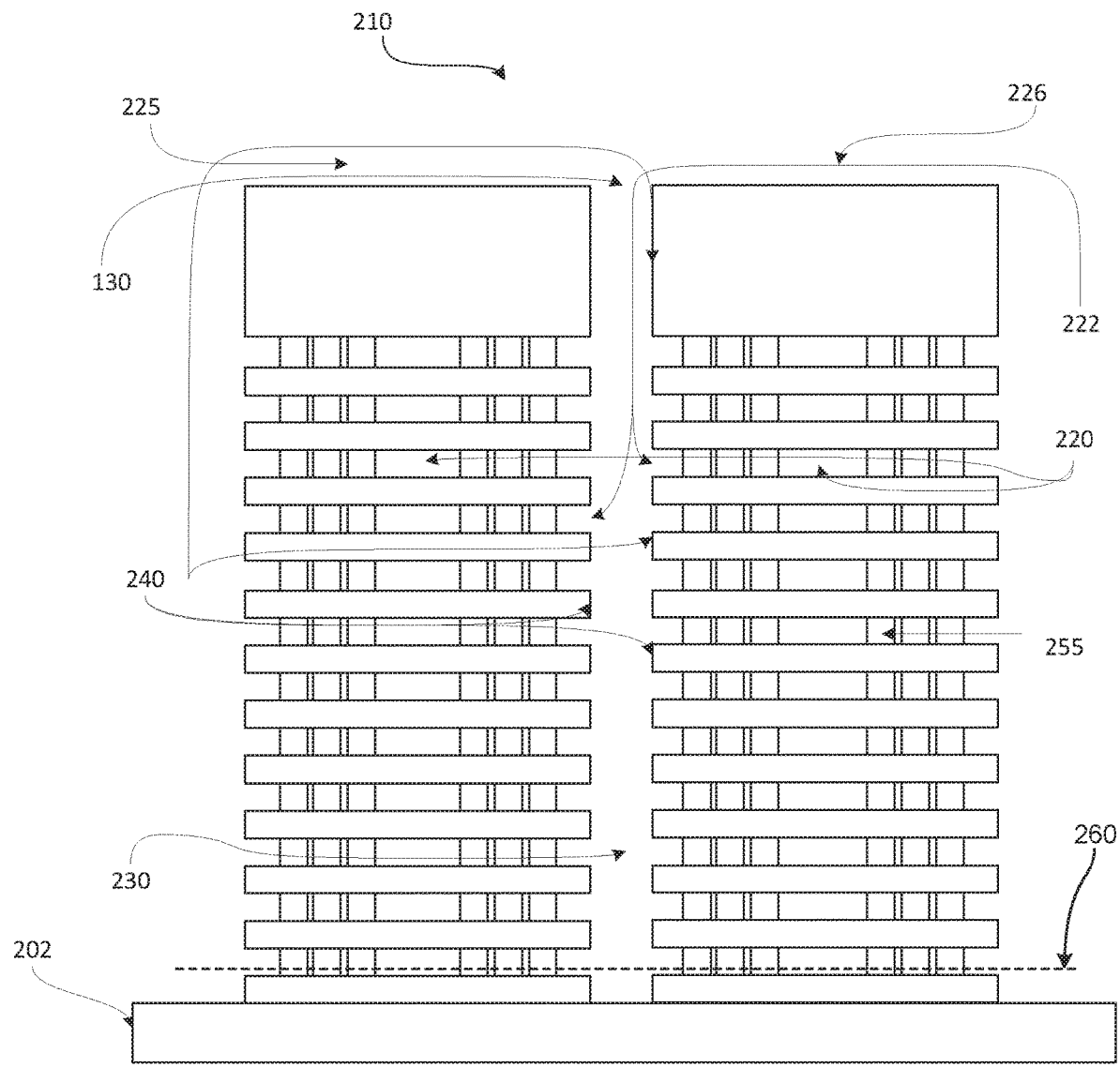

Horizontal features, such as in 3-D memory structures, can also be filled. FIG. 2E shows an example of a horizontal feature 250 that includes a constriction 251. For example, horizontal feature 250 may be a word line in a 3D NAND (also referred to as vertical NAND or VNAND) structure. In some implementations, the constrictions can be due to the presence of pillars in a 3D NAND or other structure. FIG. 2F presents a cross-sectional side-view of a 3-D NAND structure 210 (formed on a silicon substrate 202) having VNAND stacks (left 225 and right 226), central vertical structure 230, and a plurality of stacked horizontal features 220 with openings 222 on opposite sidewalls 240 of central vertical structure 230. Note that FIG. 2F displays two "stacks" of the exhibited 3-D NAND structure 210, which together form the "trench-like" central vertical structure 230, however, in certain embodiments, there may be more than two "stacks" arranged in sequence and running spatially parallel to one another, the gap between each adjacent pair of "stacks" forming a central vertical structure 230, like that explicitly illustrated in FIG. 2F. In this embodiment, the horizontal features 120 are 3-D memory wordline features that are fluidically accessible from the central vertical structure 230 through the openings 222. Although not explicitly indicated in the figure, the horizontal features 220 present in both the 3-D NAND stacks 225 and 226 shown in FIG. 2F (i.e., the left 3-D NAND stack 225 and the right 3-D NAND stack 226) are also accessible from the other sides of the stacks (far left and far right, respectively) through similar vertical structures formed by additional 3-D NAND stacks (to the far left and far right, but not shown). In other words, each 3-D NAND stack 225, 226 contains a stack of wordline features that are fluidically accessible from both sides of the 3-D NAND stack through a central vertical structure 1230. In the particular example schematically illustrated in FIG. 2F, each 3-D NAND stack contains 6 pairs of stacked wordlines, however, in other embodiments, a 3-D NAND memory layout may contain any number of vertically stacked pairs of wordlines.

The wordline features in a 3-D NAND stack are typically formed by depositing an alternating stack of silicon oxide and silicon nitride layers, and then selectively removing the nitride layers leaving a stack of oxides layers having gaps between them. These gaps are the wordline features. Any number of wordlines may be vertically stacked in such a 3-D NAND structure so long as there is a technique for forming them available, as well as a technique available to successfully accomplish (substantially) void-free fills of the vertical features. Thus, for example, a VNAND stack may include between 2 and 256 horizontal wordline features, or between 8 and 128 horizontal wordline features, or between 16 and 64 horizontal wordline features, and so forth (the listed ranges understood to include the recited end points).

Figure 2G:
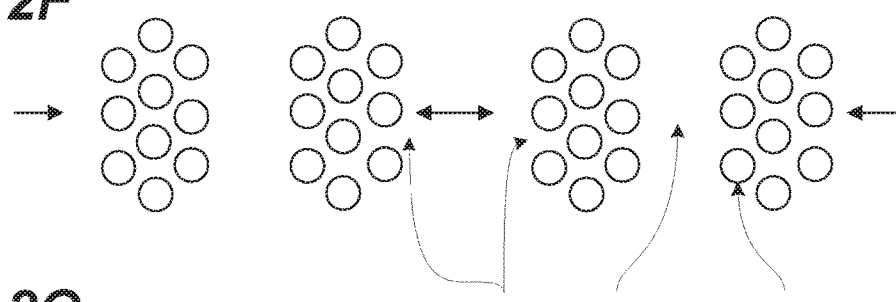

FIG. 2G presents a cross-sectional top-down view of the same 3-D NAND structure 210 shown in side-view in FIG. 2F with the cross-section taken through the horizontal section 260 as indicated by the dashed horizontal line in FIG. 2F. The cross-section of FIG. 2G illustrates several rows of pillars 255, which are shown in FIG. 1F to run vertically from the base of semiconductor substrate 202 to the top of 3-D NAND stack 210. In some embodiments, these pillars 255 are formed from a polysilicon material and are structurally and functionally significant to the 3-D NAND structure 210. In some embodiments, such polysilicon pillars may serve as gate electrodes for stacked memory cells formed within the pillars. The top-view of FIG. 2G illustrates that the pillars 255 form constrictions in the openings 222 to wordline features 220—i.e. fluidic accessibility of wordline features 220 from the central vertical structure 230 via openings 222 (as indicated by the arrows in FIG. 2G) is inhibited by pillars 255. In some embodiments, the size of the horizontal gap between adjacent polysilicon pillars is between about 1 and 20 nm. This reduction in fluidic accessibility increases the difficulty of uniformly filling wordline features 120 with material. The structure of wordline features 220 and the challenge of uniformly filling them with molybdenum material due to the presence of pillars 255 is further illustrated in FIGS. 2H, 2I, and 2J.

Figure 2H:
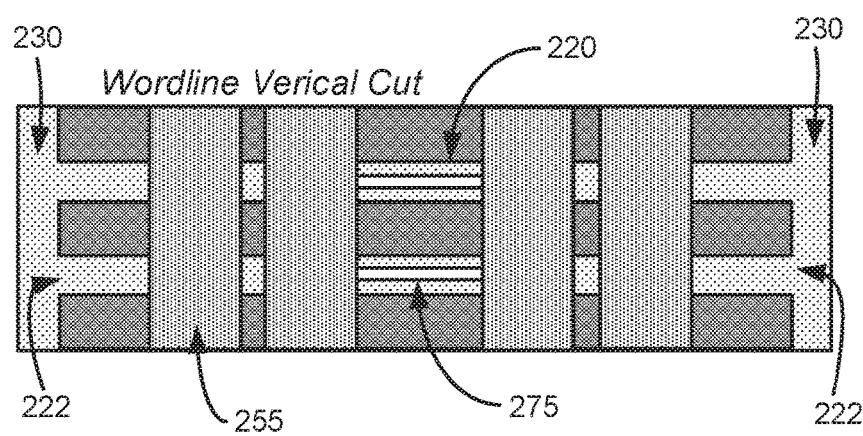
Figure 2I:
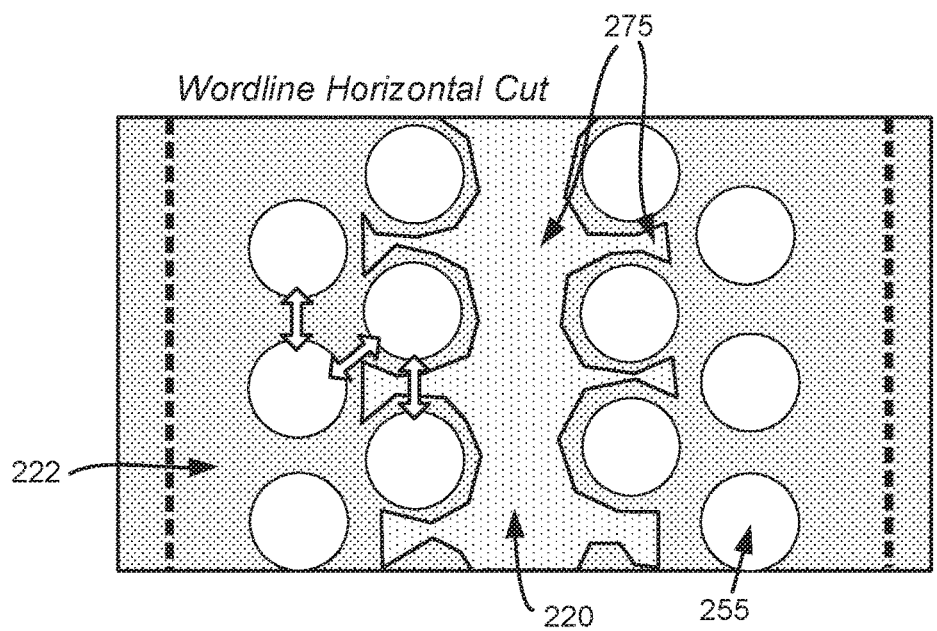
Figure 2J:
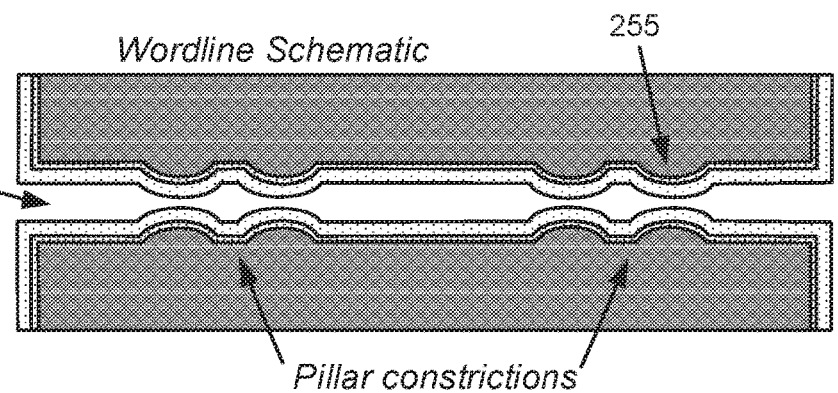

FIG. 2H exhibits a vertical cut through a 3-D NAND structure similar to that shown in FIG. 2F, but here focused on a single pair of wordline features 220 and additionally schematically illustrating a fill process which resulted in the formation of a void 275 in the filled wordline features 120. FIG. 2I also schematically illustrates void 175, but in this figure illustrated via a horizontal cut through pillars 155, similar to the horizontal cut exhibited in FIG. 2G. FIG. 2J illustrates the accumulation of molybdenum material around the constriction-forming pillars 255, the accumulation resulting in the pinch-off of openings 222, so that no additional molybdenum material can be deposited in the region of voids 275. Apparent from FIGS. 2H and 2I is that void-free molybdenum fill relies on migration of sufficient quantities of deposition precursor down through vertical structure 230, through openings 222, past the constricting pillars 255, and into the furthest reaches of wordline features 220, prior to the accumulated deposition of molybdenum around pillars 255 causing a pinch-off of the openings 222 and preventing further precursor migration into wordline features 220. Similarly, FIG. 2J exhibits a single wordline feature 220 viewed cross-sectionally from above and illustrates how a generally conformal deposition of molybdenum material begins to pinch-off the interior of wordline feature 220 due to the fact that the significant width of pillars 255 acts to partially block, and/or narrow, and/or constrict what would otherwise be an open path through wordline feature 220. (It should be noted that the example in FIG. 2J can be understood as a 2-D rendering of the 3-D features of the structure of the pillar constrictions shown in FIG. 2I, thus illustrating constrictions that would be seen in a plan view rather than in a cross-sectional view.)

Three-dimensional structures may need longer and/or more concentrated exposure to precursors to allow the innermost and bottommost areas to be filled. Three-dimensional structures can be particularly challenging when employing molybdenum halide and/or molybdenum oxyhalide precursors because of their proclivity to etch, with longer and more concentrated exposure allowing for more etch as parts of the structure.

Examples of feature fill for horizontally-oriented and vertically-oriented features are described below. It should be noted that in at least most cases, the examples are applicable to both horizontally-oriented or vertically-oriented features. Moreover, it should also be noted that in the description below, the term "lateral" may be used to refer to a direction generally orthogonal to the feature axis and the term "vertical" to refer to a direction generally along the feature axis.

Distribution of a material within a feature may be characterized by its step coverage. For the purposes of this description, "step coverage" is defined as a ratio of two thicknesses, i.e., the thickness of the material inside the feature divided by the thickness of the material near the opening. For purposes of this document, the term "inside the feature" represents a middle portion of the feature located about the middle point of the feature along the feature's axis, e.g., an area between about 25% and 75% of the distance or, in certain embodiments, between about 40% and 60% of the distance along the feature's depth measured from the feature's opening, or an end portion of the feature located between about 75% and 95% of the distance along the feature's axis as measured from the opening. The term "near the opening of the feature" or "near the feature's opening" represents a top portion of the feature located within 25% or, in some embodiments, within 10% of the opening's edge or other element representative of the opening's edge. A conformal film will have step coverage of an approximately 100%. Step coverage of over 100% can be achieved, for example, by filling a feature with more material in the middle or near the bottom of the feature than at the feature opening.

Figure 3:
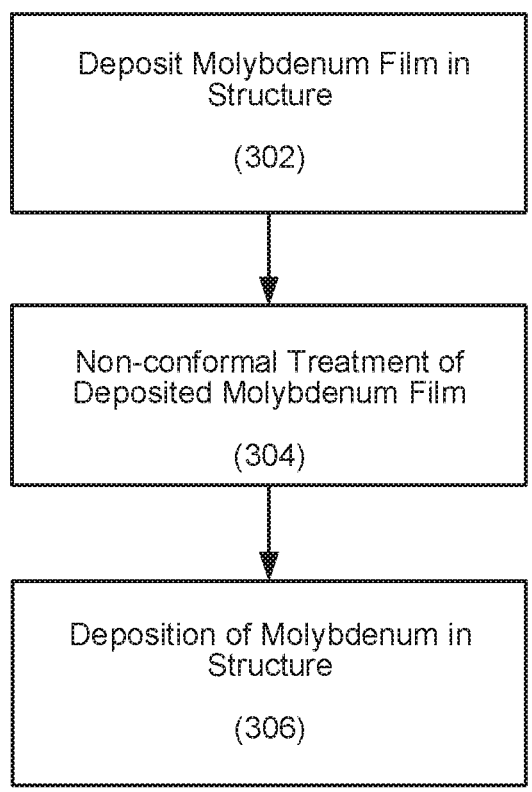
FIG. 3 is a process diagram illustrating operations in filling a structure with molybdenum according to various embodiments.

FIG. 3 is a process diagram illustrating operations in filling a structure with molybdenum according to various embodiments. First, a molybdenum (Mo) film is deposited in the structure in an operation 302. This operation may be referred to as Dep1. In many embodiments, operation 302 is a generally conformal deposition that lines the exposed surfaces of the structures. For example, in a 3D NAND structure such as that shown in FIG. 2F, the Mo film lines the wordline features 220. According to various embodiments, the Mo film is deposited using an ALD process to achieve good conformality. Further description of Mo ALD processes are given below. In some embodiments, after operation 302, the features are not closed off with Mo, but sufficiently open to allow further reactant gases to enter the features in a subsequent deposition.

Next, in an operation 304, the deposited film is non-conformally treated. Non-conformal treatment in this context refers to the treatment being preferentially applied at and near the opening or openings of the feature than in the feature interior. For 3D NAND structures, the treatment may be conformal in the vertical direction such that the bottom wordline feature is treated to approximately the same extent as the top wordline feature, while non-conformal in that the interior of the wordline features are not exposed to the treatment or to a significantly lesser extent than the feature openings.

Nucleation inhibition inhibits subsequent molybdenum nucleation at the treated surfaces. It can involve one or more of: deposition of an inhibition film, reaction of treatment species with the Mo film to form a compound film (e.g., $Mo_2N$), and adsorption of inhibition species. During the subsequent deposition operation, there is a nucleation delay on the inhibited portions of the underlying film relative to the non- or lesser-inhibited portions. Etch removes deposited film at the treated surfaces. This can involve reacting an etchant species with the molybdenum film to form a gaseous byproduct that is then removed. Other methods of etching, including atomic layer etching, may be performed. Operation 304 may be a plasma or a non-plasma operation. If a non-plasma operation, it may be purely thermal or activated by some other energy such as UV.

Nitrogen acts as inhibition species and halogen (e.g., fluorine and chlorine) species act as etchants. To perform a purely inhibition treatment, operation 304 can involve exposing the Mo film to a nitrogen-containing chemistry that does not contain halogens. To perform a purely etch treatment, operation 304 can involve exposing the Mo film to a halogen-containing chemistry that does not contain nitrogen. Other inhibition chemistries (e.g., oxygen-containing chemistries) may be used in some embodiments. Exposing the film to both a nitrogen-containing and halogen-containing chemistry (e.g., nitrogen trifluoride ($NF_3$) or ammonia/fluorine ($NH_3/F_2$)) can both inhibit and etch.

According to various embodiments, operations 302 may be performed in the same processing chamber or in different processing chambers. If performed in the same chamber, they may be performed in a single-station or multi-station chamber. In a multi-station chamber, operation 302 may be performed in a first station and operation 304 in a second station in some embodiments. As discussed further below, operation 304 may be a continuous flow or pulsed process. In the latter case, different gases may be pulsed in sequence to tune the treatment.

After operation 304, a second deposition is performed in operation 306. The second deposition may be performed by an ALD or CVD process. ALD processes are described further below with respect to FIG. 8 and generally involve alternating pulses of reactants for surface-mediated reactions. In CVD methods, the reactants are generally flowed such that they exist in vapor phase in the reaction chamber. CVD may involve vapor phase reactions. For deposition into 3D NAND structures, an ALD process may be used to allow for good step coverage throughout the structure. Gases more easily reach feature interiors due to the effect(s) of the treatment. After an etch process, film deposited near the feature entrance is removed, allowing more space for gases to reach the interior of the feature and preventing pinch-off. In some embodiments, enough Mo film may be removed such that an underlying surface is wholly or partially exposed, increasing nucleation delay at these areas. After an inhibition process, nucleation delay is increased, allowing an inside-out fill process. Operation 306, which may be referred to as a Dep2 process, may complete fill of the structures in some embodiments. In other embodiments, one more additional treatment/deposition operations may be performed. To tailor lateral non-conformality in the wordlines, pressure and treatment gas flow rate may be adjusted. Higher chamber pressure and lower treatment gas flow rate (and/or concentration) promotes treatment at the openings of the wordline features over treatment within the interiors of the wordline features. Thus, in some embodiments, chamber pressure may lowered from operation 602 to 604. Example chamber pressures range from 3 Torr to 40 Torr.

To achieve lateral non-conformality but have top-to-bottom uniformity, charge vessels may be used to deliver the gases. These are described below with respect to FIG. 7 and can be especially useful for deep structures (e.g., 7-10 microns deep). In some embodiments, deposition and a non-conformal treatment may be performed concurrently. For example, operations 302 and 304 in FIG. 3 may be performed concurrently. According to various embodiments, a subsequent deposition (e.g., Dep2) may be performed, or operations 302 and 304 may be sufficient to fill the feature. As indicated above, the molybdenum halides and molybdenum oxyhalides may be used as etchant gases. In some embodiments, these may be used as deposition and etchant gases. By appropriately controlling the concentration of the deposition reactants within the feature, the amount of deposition and etch can be controlled at various stages in the feature. In particular examples, molybdenum oxychlorides ($MoO_xCl_y$, where x and y are numbers greater than 0 that form a stable compound) may be used as both a Mo deposition gas and an etchant gas, with net deposition toward the interior of the feature and lower deposition or net etch toward the feature opening(s). As described further below with respect to FIG. 6D, the overall growth rate is sensitive to precursor flux or concentration at the surface. A higher $MoO_xCl_y$ flux can result in more etching in some embodiments. And, at high $MoO_xCl_y$ flux, the precursor concentration inside a feature is lower than near the opening or on the field regions, allowing for bottom-up growth. Precursor dose time, precursor flow rate, chamber pressure, precursor partial pressure can be used to tune the precursor flux.

Inhibition treatments may also be performed non-conformally during Mo deposition. For example, a Mo precursor may inhibit deposition if not fully reduced. In one example, at high $MoO_2Cl_2$ flux, $MoO_2Cl_2$ concentration is higher at the feature openings than in the interior of the feature. If $H_2$ co-reactant flow is low enough such that the $MoO_2Cl_2$ cannot all be reduced at the feature openings, it can act as an inhibitor.

Figure 4:
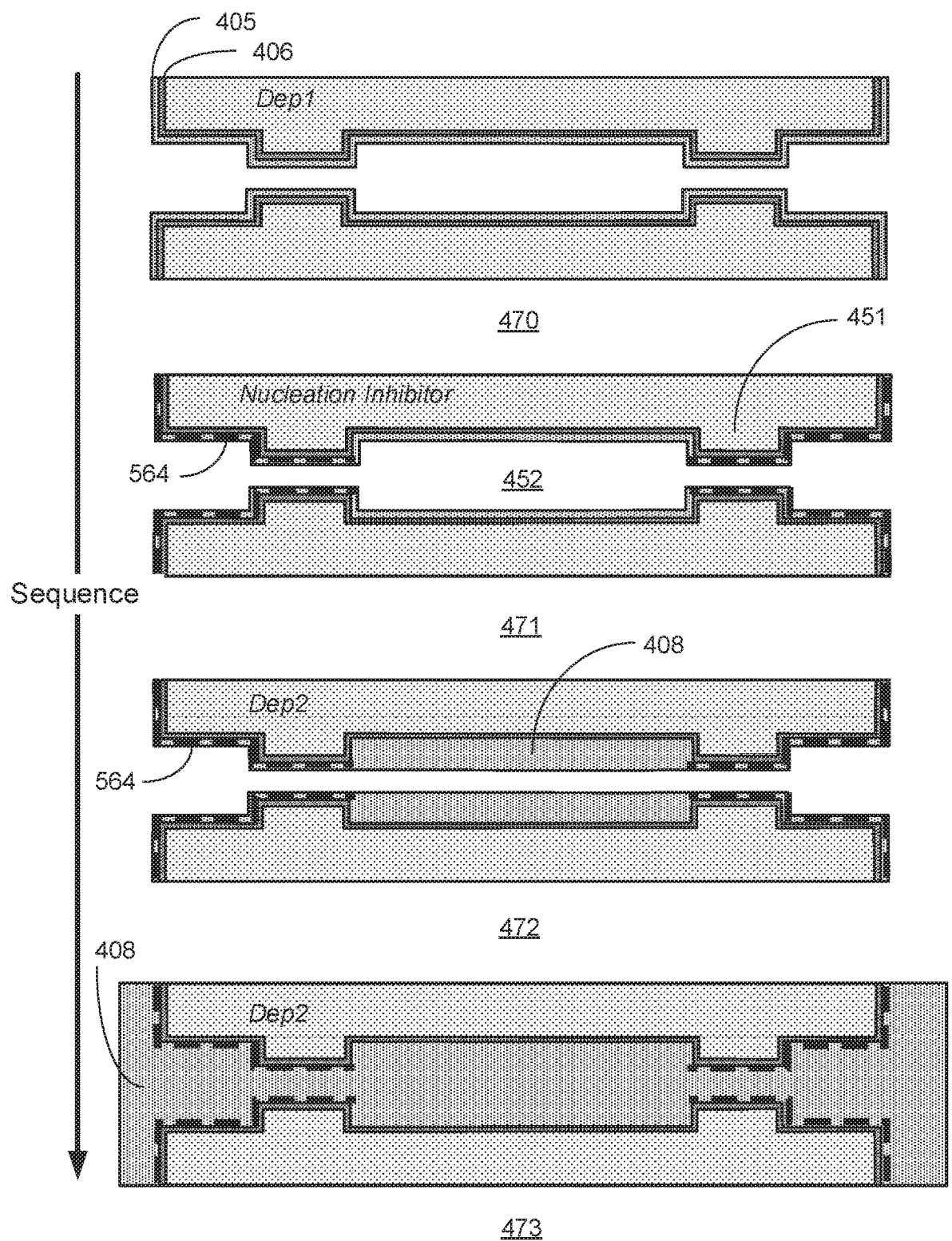
FIG. 4 illustrates an example of a process performed to fill a 3D NAND structure with molybdenum.

FIG. 4 illustrates an example of a process performed to fill a 3D NAND structure with molybdenum. In FIG. 4, a cross-sectional view of a single wordline of a 3D NAND structure is shown. (As in the example of FIG. 2J, wordline features in FIG. 4 show pillar constrictions that would be seen in a plan view rather than a cross-sectional view to illustrate the constrictions.) At 470, the wordline feature is shown after a Dep1 process. An under-layer 406 is shown; this may be for example a barrier layer. A conformal Mo film 405 lines the feature surfaces. In some embodiments, the conformal Mo film 405 is deposited directly on a dielectric surface such as an aluminum oxide or silicon oxide surface. Mo layer 405 may be a nucleation layer, a nucleation and a bulk layer, or a bulk layer. Next, the feature is exposed to an inhibition chemistry to inhibit portions 465 at 471. In this example, the portions 465 through pillar constrictions 451 are inhibited while the surfaces of the interior at 452 are not inhibited. Inhibition can involve for example, exposure to $NH_3$ gas, or exposure to a remote or direct (in-situ) plasma generated from a gas such as $N_2$, $H_2$, forming gas, $NH_3$, $O_2$, $CH_4$, etc. Next, a process is performed to selectively deposit molybdenum in accordance with the inhibition profile: bulk Mo 408 is preferentially deposited on the non-inhibited portions of the Mo layer 405, such that hard-to-fill regions behind constrictions are filled, at 472. In this example, the bulk deposition continues, filling the remainder of the feature with bulk Mo 408 at 473.

In some embodiments, the sequence shown at 471 and 472 may be performed in one operation as discussed above by using a Mo precursor that can act as an inhibitor at the feature openings during deposition.

Figure 5:
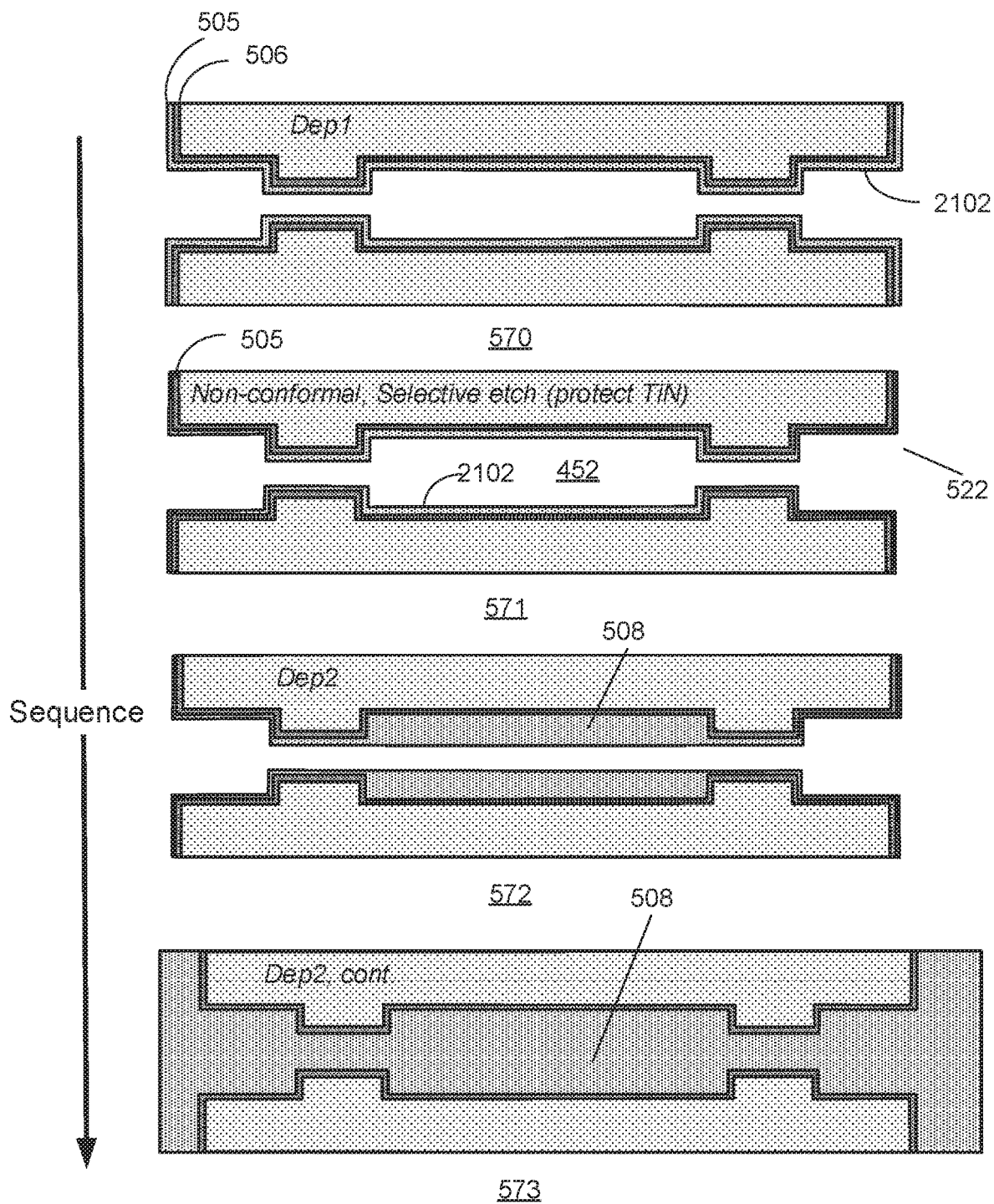
FIG. 5 illustrates another example of a process performed to fill a 3D NAND structure with molybdenum.

FIG. 5 illustrates another example of a process performed to fill a 3D NAND structure with molybdenum. In the example of FIG. 5, an under-layer 506 is shown; this may be for example a barrier layer. A conformal Mo film 505 lines the feature surfaces. In some embodiments, the conformal Mo film 505 is deposited directly on a dielectric surface such as an aluminum oxide or silicon oxide surface. Mo layer 505 may be a nucleation layer, a nucleation and a bulk layer, or a bulk layer. This is followed by a non-conformal etch (with high selectivity to protect the under-layer 506 if present) at 571. For example, a non-conformal etch having high Mo:TiN selectivity may be performed for TiN under-layers. As a result of the non-conformal etch, the conformal Mo layer 505 is left intact in the interior 552 of the feature, while thinned or completely removed at the feature openings 522. Next, bulk Mo 508 is deposited on the remaining portions of the Mo layer 405, such that hard-to-fill regions behind constrictions are filled, at 572. In this example, the bulk deposition continues, filling the remainder of the feature with bulk Mo 508 at 573. In some embodiments, a dep-etch-dep operation can be repeated to fill the feature. According to various implementations, each subsequent deposition operation may or may not include deposition of a nucleation layer. In some implementations, the treatment may also include an inhibition effect.

In some embodiments, the sequence shown at 571 and 572 may be performed in one operation as discussed above by using a Mo precursor that can act as an etchant at the feature openings during deposition.

In some embodiments, Dep1 and Dep2 each are used to deposit bulk Mo layers, Dep1 to deposit a conformal layer and Dep 2 to fill the feature in the examples of FIGS. 4 and 5.

In some embodiments, the conformal Mo layer may be characterized as low resistivity and, in some embodiments, low stress and/or low fluorine. Because the wordline features are unfilled (with the exception of the nucleation layer if deposited), a relatively fast deposition technique may be used. In some embodiments, this involves alternating pulses of a Mo-containing precursor and hydrogen ($H_2$) or other reducing agent to deposit the first tungsten layer in an ALD process. Purge operations may separate the pulses. Relatively short pulse times may be used for deposition to increase throughput.

The second bulk layer may be deposited using a second set of conditions. Like the first bulk layer, the second bulk layer may be a low resistivity layer, and in some embodiments, a low stress and/or low fluorine layer. In some embodiments, operation 306 involves increased pulse times and increased purge times relative to operation 302. In particular embodiments, Mo-containing precursor pulse times may be increased. Increasing pulse and/or purge times can facilitate reactants diffusing into the wordlines. In some embodiments, the temperature may also be changed from operation 302 to operation 306: for example higher temperature may be used to speed reaction time. In some embodiments, a lower temperature may be used to allow the reactants to diffuse into the wordline features before reaction. In some embodiments, the second set of conditions may include a change in flowrates. For example, the flow rate of the Mo-containing precursor and/or reducing agent may be increased.

A third bulk Mo layer may be deposited at different conditions. This layer may be characterized as an overburden layer that is removed in a subsequent step and can be deposited on sidewalls such as sidewalls 240 in the 3D NAND structure of FIG. 2F. This layer may be characterized as low roughness. Higher resistivity and/or fluorine concentration can be tolerated as the molybdenum is to be removed. The third set of conditions can involve any one of: faster timing if ALD is used with shorter pulse times than in operation 405, using CVD instead of ALD, and introducing nitrogen ($N_2$) during or between the flow of one or more reactant gases.

Figure 6A:
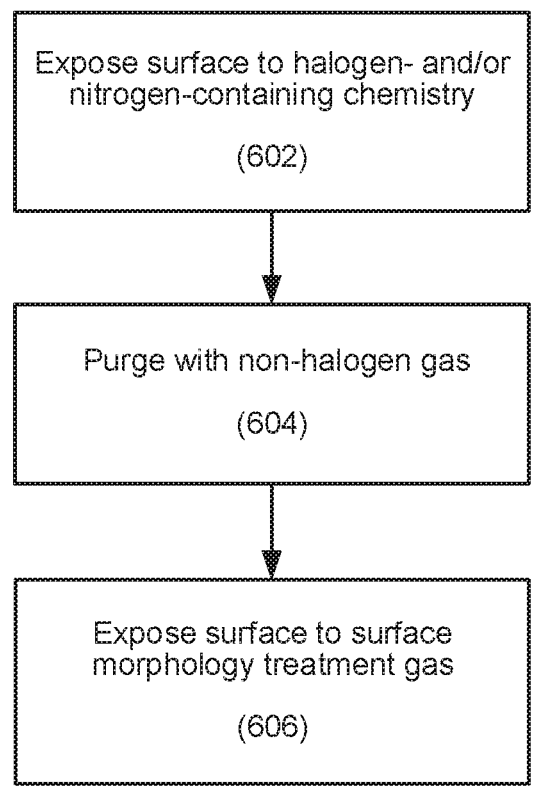
FIG. 6A is a process diagram illustrating operations in treating a molybdenum film according to according to various embodiments.

FIG. 6A is a process diagram illustrating operations in treating a Mo film according to according to various embodiments. First, in an operation 602, the surface is exposed to a halogen- and/or nitrogen-containing chemistry. In operation 602, nitrogen is an inhibition chemistry; other inhibition chemistries may be used in addition to or instead of nitrogen as appropriate. Fluorine- and chlorine-containing chemistries are used for etch. Operation 602 may be a continuous flow or a pulsed operation and may be a plasma or thermal, non-plasma operation. Other activation energies may also be applied.

Example nitrogen-containing gases for inhibition include $NF_3$, $NH_3$, nitrogen ($N_2$), and hydrazine ($N_2H_4$). Other nitrogen-containing gases may be used, though in many embodiments, oxygen-containing compounds (e.g., $NO_2$) are avoided. The gas may be flowed into a chamber in a non-plasma, thermal process, or may be used to generate a plasma in a remote or in-situ plasma generator. In some embodiments, less reactive gases (e.g., $N_2$) may need plasma activation for effective inhibition.

Example halogen-containing gases for etching include $NF_3$, $F_2$, hydrogen fluoride (HF), chlorine ($Cl_2$), chlorine trifluoride ($ClF_3$), and other Cl-containing or F-containing gases. Molybdenum halide and molybdenum oxyhalide gases may also be used. Without a reducing agent to react with, these will etch the film.

Next in an operation 604, there may be a purge with a non-halogen gas. An inert gas such as Ar or He may be used. $N_2$ may also be used. The purge is a non-plasma process that can remove surface chlorine or fluorine species. In some embodiments (e.g., in which the substrate is not exposed to chlorine or fluorine species in operation 602) operation 604 may be omitted.

Next, in an operation 606, the surface may be exposed to a surface morphology treatment gas. It has been found that inhibition treatments can result in a "rough" surface that can adversely affect the quality of the film deposited in Dep2. The surface morphology treatment gas may be a pulsed or continuous flow of a molybdenum precursor, a reducing agent (e.g., $H_2$), or both.

Figure 6B:
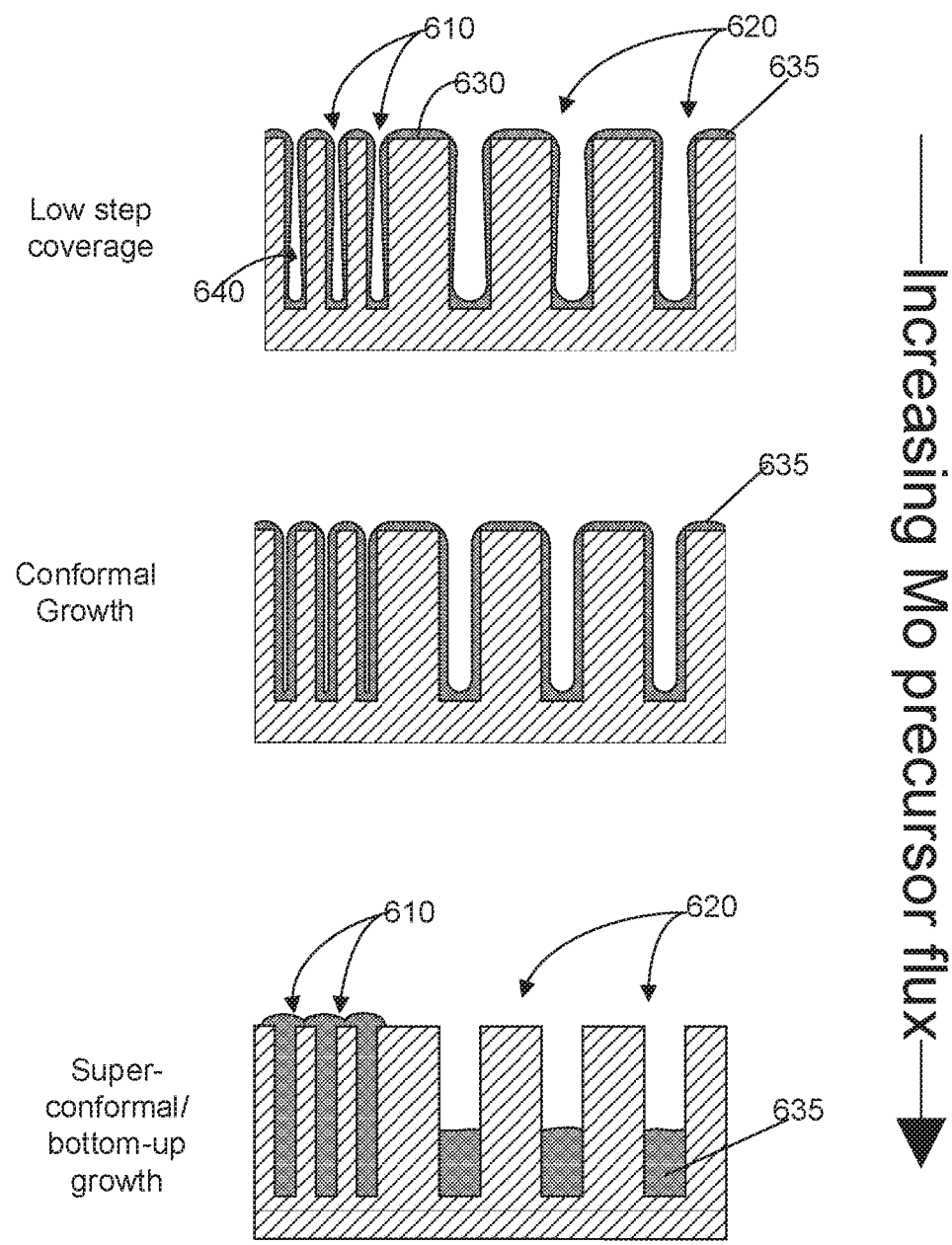
FIG. 6B shows schematic examples of structures that include narrower, denser features and wider, less dense features and how step coverage of a molybdenum film can be modified by controlling molybdenum precursor flux.

In some embodiments, operations 602-606 are repeated one or more times. For example, each of the operations can be performed as a pulse in a multi-cycle sequence of pulses. In alternate embodiments, operation 602 may be performed as multiple cycles of pulses with one or both of operations 604 and 606 performed only at the completion of the multiple cycles. The order of operations 604 and 606 may be reversed in some embodiments. In some embodiments, molybdenum feature fill may be performed by controlling the precursor flux to control the step coverage of the resulting fill. FIG. 6B shows schematic examples of structures that include narrower, denser features 610 and wider, less dense features 620, and how step coverage of Mo film 635 can be modified by appropriately controlling Mo precursor flux. (As flux is the flow rate per unit area, the flux may be increased or decreased by increasing or decreasing the flow rate into the chamber). At a relatively low precursor flux, the step coverage is low with more Mo deposited near the top of the features and on the field regions 630 than at the feature interiors 640.

As the precursor flux is increased, the deposition becomes conformal with approximately the same amount of Mo deposited conformally throughout the features. This increase in step coverage observed with increasing precursor flux may be due to a transition from mass transfer limited growth to surface reaction limited growth.

With still higher precursor flux, the growth becomes super-conformal in the narrower, denser feature 610. Bottom-up growth is observed as can be seen in the wider, less dense feature 620 which show Mo film 635 in the bottoms of the features 620 but without significant deposition on the sidewalls of these features.

Figure 6C:
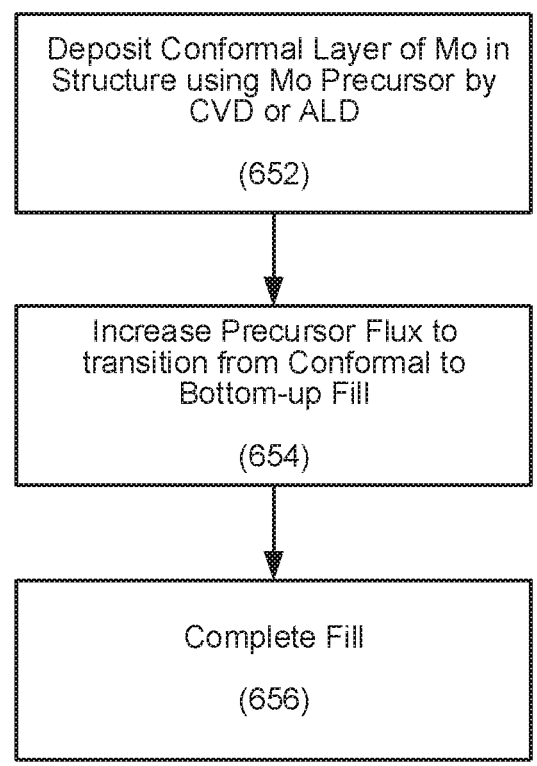
FIG. 6C is a process diagram illustrating operations in filling a structure with molybdenum according to various embodiments.

In some embodiments, precursor flux may be changed during Mo feature fill. For example, in a first stage of Mo fill, conformal growth conditions may be used with growth in field regions suppressed. In a subsequent stage, precursor flux is increased with super-conformal and bottom-up growth. A multi-step process may be used advantageously to fill features of varying sizes. FIG. 6C is a process diagram illustrating operations in filling a structure with molybdenum according to various embodiments. In the process of FIG. 6C, a conformal layer of Mo is deposited in a feature. (652). CVD or ALD may be used. Then, in an operation 654, precursor flux is increased to transition to bottom-up fill. To increase precursor flux, one or more of the following may be increased: Mo precursor partial pressure, Mo precursor flow rate, and Mo precursor dose time. Fill can be completed in operation 656. In some embodiments, operation 656 is a continuation of the conditions in operation 654. In other embodiments, once the feature is filled to a certain point, precursor flux may be decreased.

The Mo growth rate is sensitive to precursor flux and precursor concentration at the surface. In some embodiments, bottom-up growth is observed at high precursor flux conditions where precursor concentration deeper inside the features is lower than precursor concentration at the field regions and near the top of the features. This is because higher precursor flux can favor etch over deposition reactions, leading to a lower growth rate. Chlorine-containing Mo precursors, for example, can result in deposition and etching reactions:

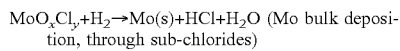
(Mo bulk deposition, through sub-chlorides)

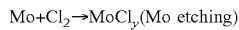
(Mo etching)

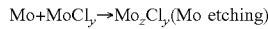
(Mo etching)

If an underlayer is present, e.g., a W underlayer, it can be etched under certain conditions:

(W etching)

(W etching)

Figure 6D:
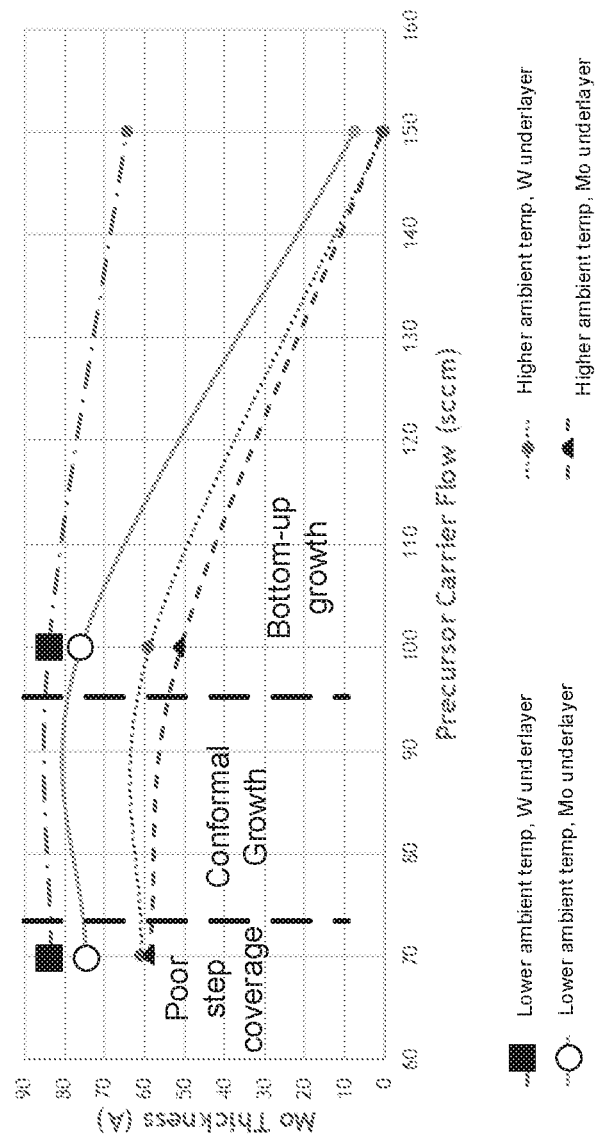
FIG. 6D is a graph showing deposited molybdenum thickness as a function of molybdenum precursor flow rate.

The reactions given above are examples of reactions that may occur under high Mo precursor conditions. FIG. 6D is a graph showing deposited molybdenum thickness as a function of molybdenum precursor flow rate. FIG. 6D shows how net deposition of Mo can decrease at high precursor flux conditions using $MoOCl_4$. (The data in FIG. 6D is from CVD deposition of Mo; however, the same trends are observed with ALD. Lower and higher ambient temperatures different by 10° C.) Three deposition regimes are shown: poor step coverage, conformal growth, and bottom-up growth. As can be seen from FIG. 6D, at a high precursor flow rates, net deposition decreases. This can lead to bottom-up fill with precursor concentration higher at the top of the features (resulting in lower deposition rate) and lower in the features (resulting in higher deposition rate). As described above, in the context of a laterally-oriented feature as in FIGS. 4 and 5, bottom-up fill (i.e., non-conformal fill) is inside-out fill, with feature filled from the interior out.

The methods may be implemented using multiple charging vessels. An example apparatus is shown schematically in FIG. 7, in which the 3 gas sources (treatment gas 1, treatment gas 2, and purge gas) are connected to a charge vessel. In some embodiments, one or more gas sources may be connected to multiple charge vessels. The apparatus includes a gas manifold system, which provides line charges to the various gas distribution lines. The manifolds provide the treatment gases and purge gas to the deposition chamber through valved charged vessels. The various valves are opened or closed to provide a line charge, i.e., to pressurize the distribution lines.

Using charge vessels can enable delivering treatment gases to the bottom of high aspect ratio structures, e.g., to the bottom wordline of 3D NAND structures. Pressurized gas flows through the showerhead and reaches the wafer or other workpiece that it to be treated.

Examples of treatments sequences include:

Example 1: one or multiple cycles of ($NF_3$+Ar/purge/$H_2$+Ar) where + indicates the gas are flowed into the chamber at the same time and "/" indicates a temporal separation.

Example 2: one or multiple cycles of ($NH_3$+Ar/$H_2$+Ar)

Example 3: one or multiple cycles of ($NH_3$+Ar/Mo precursor+$H_2$+Ar)

Example 4: one or multiple cycles of ($NH_3$+Ar/Mo precursor+Ar)

Mo Deposition

To deposit molybdenum in the above-described methods, Mo-containing precursors including molybdenum hexafluoride ($MoF_6$), molybdenum pentachloride ($MoCl_5$), molybdenum dichloride dioxide ($MoO_2Cl_2$), molybdenum tetrachloride oxide ($MoOCl_4$), and molybdenum hexacarbonyl ($Mo(CO)_6$) may be used. Mo-containing precursors may be halide precursors, which include $MoF_6$ and $MoCl_5$ as well as mixed halide precursors that have two or more halogens that can form a stable molecule. An example of a mixed halide precursor is $MoCl_xBr_y$, with x and y being any number greater than 0 that can form a stable molecule. Organometallic precursors including $Mo(X)_m(L)_n$ precursors wherein each X is a halogen independently selected from the group consisting of F, Cl, Br, and I; each L is an organic ligand that includes an element selected from the group consisting of N, O, and S, and wherein m is selected from 1-4, and n is selected from 1-3 as disclosed in U.S. Provisional Patent Application No. 62/816,648. Organometallic precurors such as molybdenum silylcyclopentadienyl and molybdenum silylallyl complexes may be also be used.

Deposition of Mo Films

Figure 8:
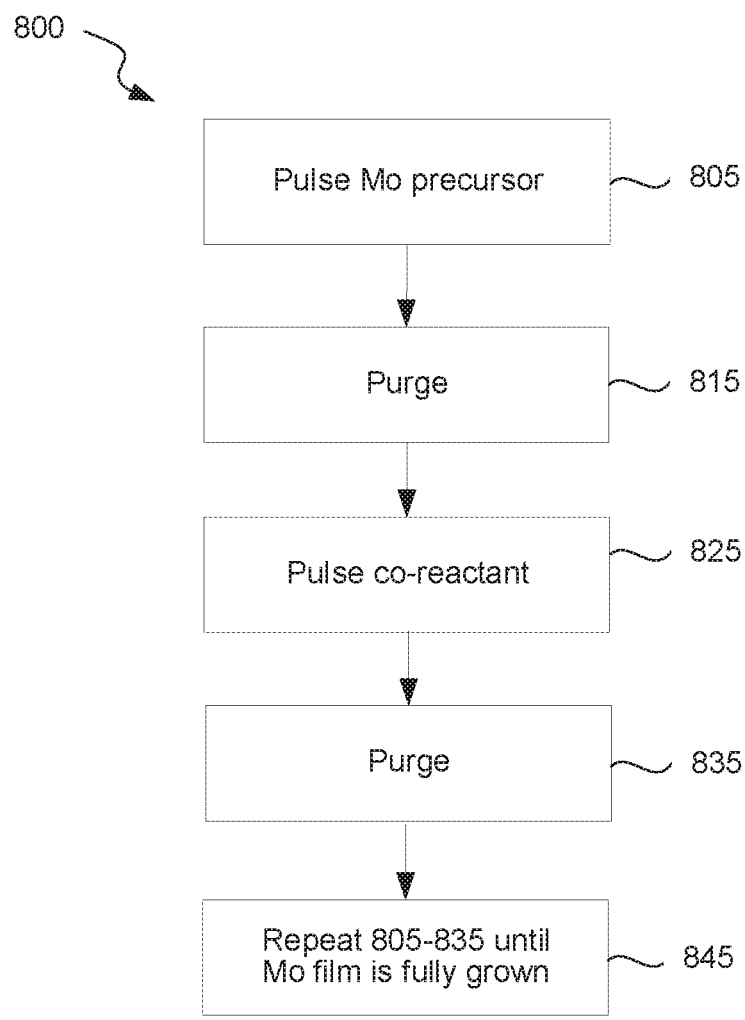
FIG. 8 is a process diagram showing operations in an ALD method of forming a molybdenum film.

FIG. 8 shows an example of an ALD method of forming a Mo film. The method according to FIG. 8 may be used, for example, in one or both of operations 302 and 306 of FIG. 3, and in any of the operations in FIG. 6C. First, in an operation 805, the Mo precursor is pulsed. After the Mo precursor is pulsed, an optional purge 815 may occur. Argon or any inert gas may be used to purge the chamber of any unadsorbed precursor. The substrate is exposed to a co-reactant 825, which may be a reducing agent to reduce the Mo precursor or other co-reactant to react with the Mo precursor to form elemental Mo. The reactant may be a hydrogen-containing reactant. In some embodiments, the hydrogen-containing reactant may be thermal (non-plasma) hydrogen ($H_2$). For plasma-based process, a remote or in-situ plasma generated from $H_2$ may be used. An optional purge may be performed at 835, followed by repeating operations 805-835 until the film is fully grown. This may be a conformal film lining a feature, such as conformal Mo film 405 or 505 or a bulk layer that fills all or some of the feature such as bulk Mo 408 or 508.

In some embodiments, operation 302 in Figure includes deposition of Mo nucleation layer, either as the conformal layer, or as a part of the conformal layer on which bulk Mo is deposited.

In some embodiments, a Mo nucleation layer is deposited using one or more of a boron-containing reducing agent (e.g., $B_2H_6$) or a silicon-containing reducing agent (e.g., $SiH_4$) as a co-reactant. For example, one or more S/Mo cycles, where S/Mo refers to a pulse of silane followed by a pulse of a Mo-containing precursor, may be employed to deposit a Mo nucleation layer on which a bulk Mo layer is deposited. In another example, one or more B/Mo cycles, where B/Mo refers to a pulse of diborane followed by a pulse of a Mo-containing precursor, may be employed to deposit a Mo nucleation layer on which a bulk Mo layer is deposited. B/Mo and S/Mo cycles may both be used to deposit a Mo nucleation layer, e.g., x(B/Mo)+y(S/Mo), with x and y being integers. Examples of B- and S-containing reducing agents are given below. For deposition of a Mo nucleation layers, in some embodiments, the Mo-containing precursor may be a non-oxygen containing precursor, e.g., $MoF_6$ or $MoCl_5$. Oxygen in oxygen-containing precursors may react with a silicon- or boron-containing reducing agent to form $MoSi_xO_y$ or $MoB_xO_y$, which are impure, high resistivity films. Oxygen-containing precursors may be used with oxygen incorporation minimized. In some embodiments, $H_2$ may be used as a reducing gas instead of a boron-containing or silicon-containing reducing gas. Example thicknesses for deposition of a Mo nucleation layer range from 5 Å to 30 Å. Films at the lower end of this range may not be continuous; however, as long as they can help initiate continuous bulk Mo growth, the thickness may be sufficient. In some embodiments, the reducing agent pulses may be done at lower substrate temperatures than the Mo precursor pulses. For example, or $B_2H_6$ or a $SiH_4$ (or other boron- or silicon-containing reducing agent) pulse may be performed at a temperature below 300° C., with the Mo pulse at temperatures greater than 300° C.

Figure 9:
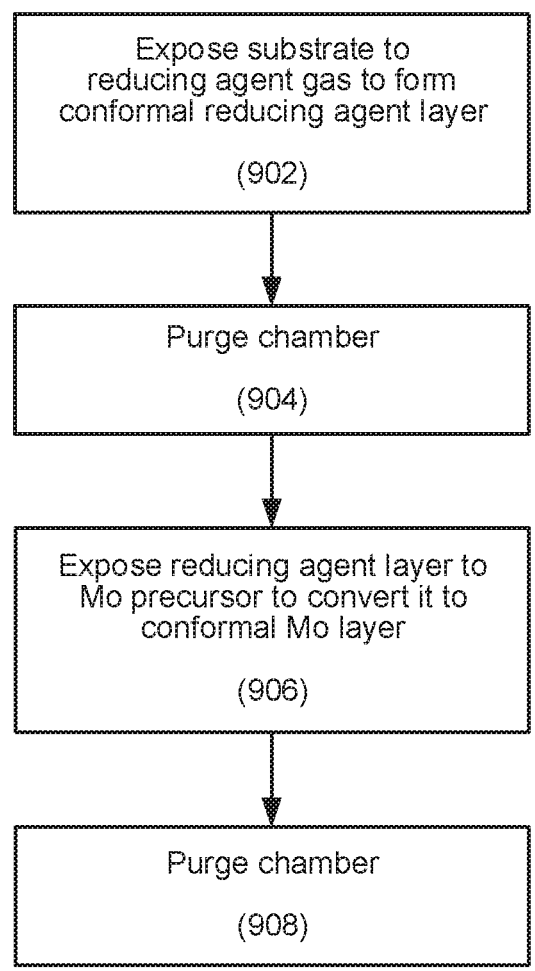
FIG. 9 is a process diagram showing operations in a of forming a molybdenum film using a reducing agent layer.

Conformal deposition may also be performed directly on surfaces such as dielectric and TiN surfaces by a process as shown in FIG. 9. It may also be used on W-containing initiation surfaces or Mo nucleation layers. In operation 902, the substrate is exposed to a reducing agent gas to form a reducing agent layer. In some embodiments, the reducing agent gas may be a silane, a borane, or a mixture of a silane and diborane. Examples of silanes including $SiH_4$ and $Si_2H_6$ and examples of boranes include diborane ($B_2H_6$), as well as $B_nH_{n+4}$, $B_nH_{n+6}$, $B_nH_{n+8}$, $B_nH_m$, where n is an integer from 1 to 10, and m is a different integer than n. Other boron-containing compounds may also be used, e.g., alkyl boranes, alkyl boron, aminoboranes $(CH_3)_2NB(CH_2)_2$, carboranes such as $C_2B_nH_{n+2}$. In some implementations, the reducing agent layer may include silicon or silicon-containing material, phosphorous or a phosphorous-containing material, germanium or a germanium-containing material, boron or boron-containing material that is capable of reducing a tungsten precursor and combinations thereof. Further example reducing agent gases that can be used to form such layers include $PH_3$, $SiH_2Cl_2$, and $GeH_4$. According to various embodiments, hydrogen may or may not be run in the background. (While hydrogen can reduce tungsten precursors, it does not function as a reducing agent in a gas mixture with a sufficient amount of stronger reducing agents such as silane and diborane.)

In some embodiments, the reducing agent gas is a mixture including a small amount of a boron-containing gas, such as diborane, with another reducing agent. The addition of a small amount of a boron-containing gas can greatly affect the decomposition and sticking coefficient of the other reducing agent. It should be noted that exposing the substrate sequentially to two reducing agents, e.g., silane and diborane may be performed. However, flowing a mixture of gases can facilitate the addition of very small amounts of a minority gas, e.g., at least a 100:1 ratio of silane to diborane. In some embodiments, a carrier gas may be flowed. In some embodiments, a carrier gas, such as nitrogen ($N_2$), argon (Ar), helium (He), or other inert gases, may be flowed during operation 902.

In some embodiments, a reducing agent layer may include elemental silicon (Si), elemental boron (B), elemental germanium (Ge), or mixtures thereof. For example, a reducing agent layer may include Si and B. The amount of B may be tailored to achieve high deposition rate of the reducing agent layer but with low resistivity. In some embodiments, a reducing agent layer may have between 5% and 80% B for example, or between 5% and 50% B, between 5% and 30%, or between 5% and 20% B, with the balance consisting essentially of Si and in some cases, H. Hydrogen atoms be present, e.g., $SiH_x$, $BH_y$, $GeH_z$, or mixtures thereof where x, y, and z may independently be between 0 and a number that is less than the stoichiometric equivalent of the corresponding reducing agent compound.

In some embodiments, the composition may be varied through the thickness of the reducing agent layer. For example, a reducing agent layer may be 20% B at the bottom of the reducing agent layer and 0% B the top of the layer. The total thickness of the reducing agent layer may be between 10 Å and 50 Å, and is some embodiments, between 15 Å and 40 Å, or 20 Å and 30 Å. The reducing agent layer conformally lines the feature.

Substrate temperature during operation 902 may be maintained at a temperature T1 for the film to be conformal. If temperature is too high, the film may not conform to the topography of the underlying structure. In some embodiments, step coverage of greater than 90% or 95% is achieved. For silane, diborane, and silane/diborane mixtures, conformality is excellent at 300° C. and may be degraded at temperatures of 400° C. or higher. Thus, in some embodiments, temperature during operation 902 is at most 350° C., or even at most 325° C., at most 315° C., or at most 300° C. In some embodiments, temperatures of less than 300° C. are used. For example, temperatures may be as low as 200° C.

Operation 902 may be performed for any suitable duration. In some examples, Example durations include between about 0.25 seconds and about 30 seconds, about 0.25 seconds and about 20 seconds, about 0.25 seconds and about 5 seconds, or about 0.5 seconds and about 3 seconds.

In operation 904, the chamber is optionally purged to remove excess reducing agent that did not adsorb to the surface of the substrate. A purge may be conducted by flowing an inert gas at a fixed pressure thereby reducing the pressure of the chamber and re-pressurizing the chamber before initiating another gas exposure. Example inert gases include nitrogen ($N_2$), argon (Ar), helium (He), and mixtures thereof. The purge may be performed for a duration between about 0.25 seconds and about 30 seconds, about 0.25 seconds and about 20 seconds, about 0.25 seconds and about 5 seconds, or about 0.5 seconds and about 3 seconds.

In operation 906, the substrate is exposed to a Mo-containing precursor at a substrate temperature T2. Examples of Mo-containing compounds are given above and include chlorides and oxychlorides. Use of oxygen-containing precursors can lead to impurity incorporation and higher resistivity. However, if oxygen is incorporated, a very thin, possibly discontinuous reducing agent layer may be used for an acceptable resistivity. In some embodiments, a carrier gas, such as nitrogen ($N_2$), argon (Ar), helium (He), or other inert gases, may be flowed during operation 906. Examples of temperatures are 500° C. to 700° C.

Operation 906 may be performed for any suitable duration. In some embodiments, it may involve a soak of the Mo-containing precursor and in some embodiments, a sequence of Mo-containing precursor pulses. According to various embodiments, operation 906 may or may not be performed in the presence of $H_2$. If $H_2$ is used, in some embodiments, it and the Mo-containing precursor may be applied in an ALD-type mode. For example:
Pulse of $H_2$
  Argon purge
  Pulse of Mo-containing precursor with or without $H_2$ in background
  Argon purge
Repeat The substrate temperature T2 is high enough that the Mo-containing precursor reacts with the reducing agent layer to form elemental Mo. The entire reducing agent layer is converted to Mo. In some embodiments, the temperature is at least 450° C., and may be at least 550° C. to obtain conversion of at or near 100%. The resulting feature is now lined with a conformal film of Mo. It may be between 10 Å and 50 Å, and is some embodiments, between 15A and 40A, or 20A and 30A. In general, it will be about the same thickness as the reducing agent layer. In some embodiments, it may be may be up to 5% thicker than the reducing agent layer due to volumetric expansion during the conversion.

While the description below focuses on molybdenum feature fill, aspects of the disclosure may also be implemented in filling features with other materials. For example, the treatment sequence described in FIG. 6 may be implemented with feature fill processes that use tungsten, cobalt, or ruthenium-containing materials.

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems.

In some embodiments, a first deposition may be performed at a first station that is one of two, five, or even more deposition stations positioned within a single deposition chamber. Thus, for example, hydrogen ($H_2$) and tungsten hexachloride ($MoO_2Cl_2$) may be introduced in alternating pulses to the surface of the semiconductor substrate, at the first station, using an individual gas supply system that creates a localized atmosphere at the substrate surface. Another station may be used for treatment, and a third and/or fourth for subsequent ALD bulk fill.

Figure 10:
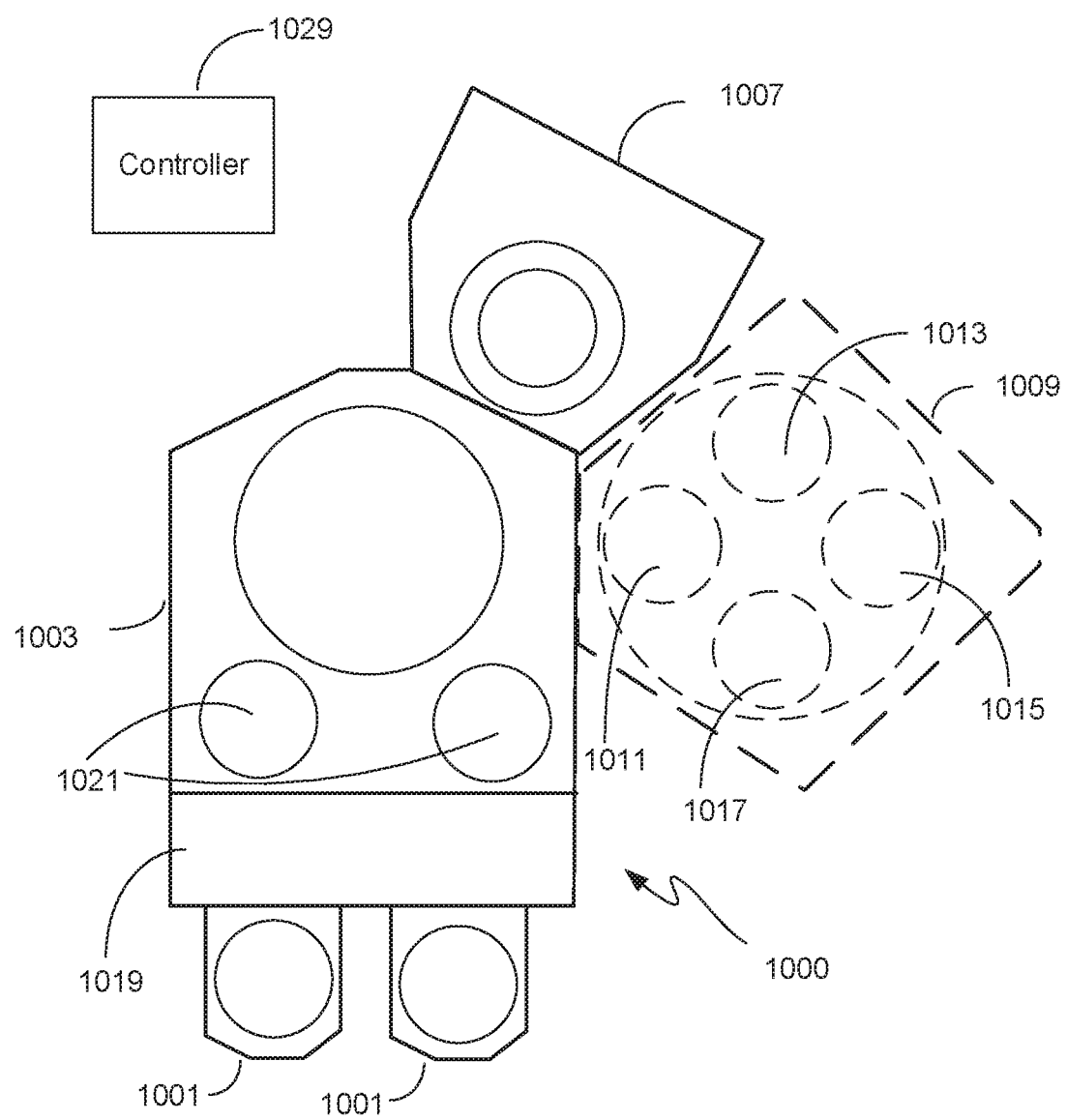
FIG. 10 is an example of an apparatus that may be used to implement the methods described herein.

FIG. 10 is a schematic of a process system suitable for conducting deposition processes in accordance with embodiments. The system 1000 includes a transfer module 1003. The transfer module 1003 provides a clean, pressurized environment to minimize risk of contamination of substrates being processed as they are moved between various reactor modules. Mounted on the transfer module 1003 is a multi-station reactor 1109 capable of performing ALD, treatment, and CVD according to various embodiments. Multi-station reactor 1009 may include multiple stations 1011, 1013, 1015, and 1017 that may sequentially perform operations in accordance with disclosed embodiments. For example, multi-station reactor 1009 may be configured such that station 1011 performs a molybdenum nucleation layer deposition using a chlorine-containing molybdenum precursor and a boron- or silicon-containing reducing agent, station 1013 performs an ALD molybdenum bulk deposition of a conformal layer using $H_2$ as reducing agent, station 1015 performs a treatment operation, and station 1017 may perform a bulk ALD fill.

Figure 7:
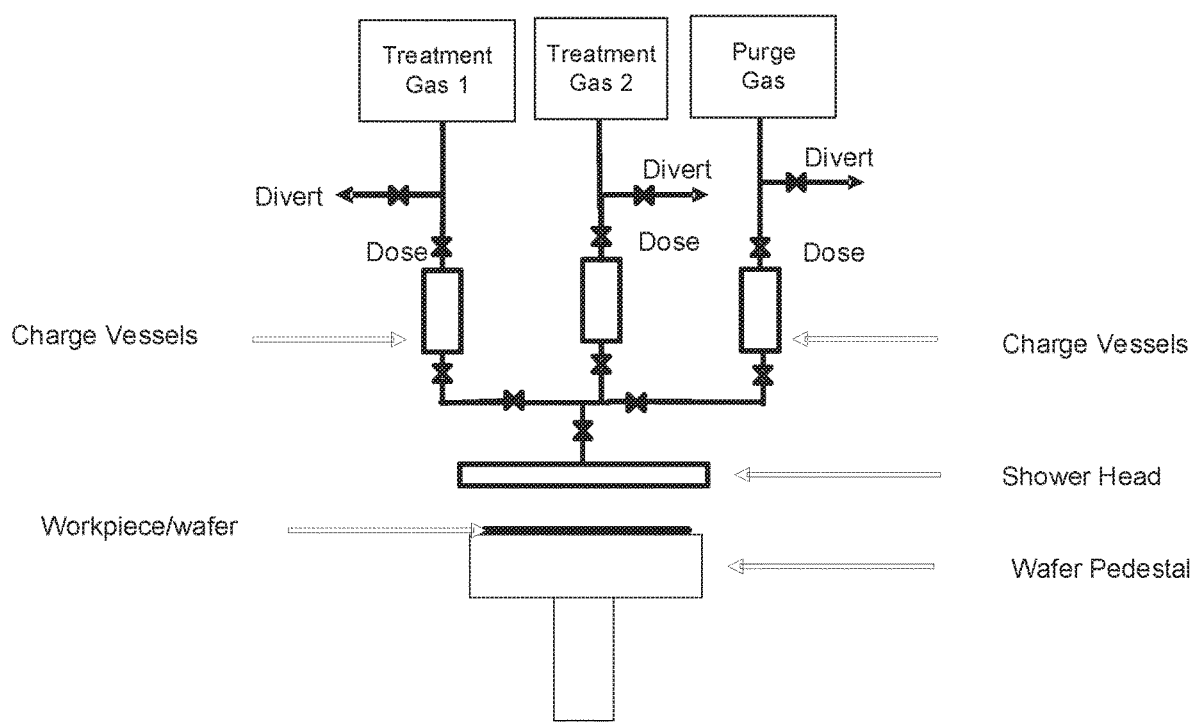
FIG. 7 is an example of an apparatus that may be used to implement the methods described herein.

Stations may include a heated pedestal or substrate support, one or more gas inlets or showerhead or dispersion plate. An example of a deposition station is depicted in FIG. 7, described above.

Returning to FIG. 10, also mounted on the transfer module 1003 may be one or more single or multi-station modules 1007 capable of performing plasma or chemical (non-plasma) pre-cleans, other deposition operations, or etch operations. The module may also be used for various treatments to, for example, prepare a substrate for a deposition process. The system 1000 also includes one or more wafer source modules 1001, where wafers are stored before and after processing. An atmospheric robot (not shown) in the atmospheric transfer chamber 1019 may first remove wafers from the source modules 1001 to loadlocks 1021. A wafer transfer device (generally a robot arm unit) in the transfer module 1003 moves the wafers from loadlocks 1021 to and among the modules mounted on the transfer module 1003.

In various embodiments, a system controller 1029 is employed to control process conditions during deposition. The controller 1029 will typically include one or more memory devices and one or more processors. A processor may include a CPU or computer, analog and/or digital input/output connections, stepper motor controller boards, etc.

The controller 1029 may control all of the activities of the deposition apparatus. The system controller 1029 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 1029 may be employed in some embodiments.

Typically there will be a user interface associated with the controller 1029. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 1029. The signals for controlling the process are output on the analog and digital output connections of the deposition apparatus 1000.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 1029 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1029, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 1029, in some implementations, may be a part of or coupled to a computer that is integrated with, coupled to the system, otherwise networked to the system, or a combination thereof. For example, the controller 10 29 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 629 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   providing a substrate comprising one or more features, each of the one or more feature having at least one opening and an interior region fluidically accessible through the at least one opening;
   depositing a first layer of molybdenum in the one or more features; and
   treating the first layer non-conformally such that that the treatment is preferentially applied at portions of the first layer near the at least one opening of the one or more features relative to portions of the first layer that are further in the interior region of the feature.

2. The method of claim 1, wherein treating the first layer non-conformally comprises inhibiting the first layer non-conformally.

3. The method of claim 2, wherein treating the first layer is performed during depositing the first layer of molybdenum.

4. The method of claim 3, wherein the method comprises exposing the one or more features to a molybdenum precursor under conditions such that the precursor flux or concentration is nearer the at least one opening of the one or more features.

5. The method of claim 4, wherein the molybdenum precursor is a molybdenum oxyhalide.

6. The method of claim 5, wherein the molybdenum oxyhalide has a lower growth rate near the one or more openings of the one or more features than in the interior region due to etch reactions.

7. The method of claim 5, wherein the molybdenum oxyhalide has a lower growth rate near the one or more openings of the one or more features than in the interior region due to an inhibition treatment.

8. The method of claim 2, wherein treating the first layer is performed after the first layer of molybdenum is deposited.

9. The method of claim 8, wherein treating the first layer comprises exposing it to an inhibition chemistry.

10. The method of claim 9, wherein the inhibition chemistry is a nitrogen-containing chemistry.

11. The method of claim 10, wherein treating the first layer comprises, after exposing it to a nitrogen-containing chemistry, exposing it to one or more of hydrogen gas and a molybdenum precursor.

12. The method of claim 8, wherein treating the first layer comprises exposing it to an etch chemistry.

13. The method of claim 12, wherein the etch chemistry is a halogen-containing chemistry.

14. The method of claim 1, wherein treating the first layer non-conformally comprises etching the first layer non-conformally.

15. The method of claim 1, wherein treating the first layer comprises exposing it to nitrogen-containing compound.

16. The method of claim 1, wherein treating the first layer comprises exposing it to halogen-containing compound.

17. The method of claim 1, wherein the treating the first layer comprises exposing it to ammonia or nitrogen trifluoride.

18. The method of claim 1, wherein treating the first layer is a non-plasma thermal process.

19. The method of claim 1, wherein treating the first layer is a plasma process.

20. The method of claim 1, wherein depositing the first layer of molybdenum comprises an atomic layer deposition process using $H_2$ as a reducing agent for a molybdenum oxyhalide or molybdenum halide precursor.

21. The method of claim 1, further comprising, after treating the first layer non-conformally, further comprising depositing a second layer of molybdenum.

22. The method of claim 1, wherein the substrate comprises a 3-D structure having sidewalls, wherein the one or more openings of the one or more features are openings in the sidewalls.

23. A method comprising:
   (a) depositing a conformal layer of a molybdenum (Mo) in a feature using a Mo precursor at first Mo precursor flow rate, Mo precursor partial pressure, and Mo precursor dose time; and
   (b) increasing at least one of Mo precursor flow rate, Mo precursor partial pressure, and Mo precursor dose time to increase the Mo precursor flux at the feature opening, to thereby deposit a second layer of Mo on the conformal layer of Mo, wherein the Mo precursor is a molybdenum halide or a molybdenum oxyhalide.

24. The method of claim 23, wherein the Mo precursor is a molybdenum oxychloride.

25. An apparatus comprising:
- a process chamber having one or more stations each configured to hold a substrate;
- one or more process gas inlets for coupling to a hydrogen ($H_2$) gas source, a molybdenum precursor gas source, an inert purge gas source, and a treatment gas source; and
- a controller for controlling operations in the apparatus, comprising machine-readable instructions for:
  (a) alternating $H_2$ and molybdenum precursor pulses into the process chamber via the one or more process gas inlets to deposit a first molybdenum layer on a substrate;
  (b) after (a), inletting a treatment gas to treat the first molybdenum layer; and
  (c) after (b), alternating $H_2$ and molybdenum precursor pulses into the process chamber via the one or more process gas inlets to deposit a first molybdenum layer on a substrate.

* * * * *